(12) United States Patent
Kang

(10) Patent No.: US 6,215,692 B1
(45) Date of Patent: Apr. 10, 2001

(54) NON-VOLATILE FERROELECTRIC MEMORY

(75) Inventor: Hee Bok Kang, Daejon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/472,844

(22) Filed: Dec. 28, 1999

Related U.S. Application Data

(63) Continuation-in-part of application No. 09/240,887, filed on Feb. 1, 1999.

(30) Foreign Application Priority Data

May 13, 1998 (KR) .................................................. 98-17213
Dec. 29, 1998 (KR) .................................................. 98-60408

(51) Int. Cl.$^7$ .................................................. G11C 11/22
(52) U.S. Cl. ...................................... 365/145; 365/230.03
(58) Field of Search ............................. 365/145, 230.03, 365/185.11, 185.13

(56) References Cited

U.S. PATENT DOCUMENTS

| | | | |
|---|---|---|---|
| 4,433,390 | 2/1984 | Carp et al. ............................. | 364/900 |
| 4,873,664 | 10/1989 | Eaton, Jr. ................................ | 365/145 |
| 4,888,630 | 12/1989 | Paterson ................................. | 357/23.5 |
| 4,928,095 | 5/1990 | Kawahara ................................ | 340/784 |
| 5,297,077 | * 3/1994 | Imai et al. ............................. | 365/145 |
| 5,371,699 | 12/1994 | Larson .................................. | 365/145 |
| 5,638,318 | 6/1997 | Seyyedy ................................. | 365/145 |
| 5,680,344 | 10/1997 | Seyyedy ................................. | 365/145 |
| 5,701,269 | * 12/1997 | Fujii .................................. | 365/230.03 |
| 5,943,256 | * 8/1999 | Shimizu et al. ........................ | 365/145 |

* cited by examiner

*Primary Examiner*—Vu A. Le
*Assistant Examiner*—VanThu Nguyen
(74) *Attorney, Agent, or Firm*—Fleshner & Kim, LLP

(57) ABSTRACT

A non-volatile ferroelectric memory is provided having improved operation characteristics such as reliability and an extended lifetime. The non-ferroelectric memory includes main cell array having a plurality of sub cell arrays, a plurality of main global bitlines and at least one pair of reference global bitlines perpendicular to the sub cell arrays, main local bitlines and reference local bitlines formed in correspondence to the main global bitlines and the reference global bitlines, and switches provided between the local bitlines and a corresponding global bitline. A reference bitline controller has a reference sense amplifier formed above or below the main cell array for sensing a signal provided through one bitline of the one pair of reference global bitlines to provide a reference voltage. A main bitline controller having a plurality of main sense amplifiers formed on one side of the reference bitline controller and is coupled to the main global bitlines, respectively, and receives the reference voltage and data through a relevant global bitline. A wordline driver and a plateline driver are formed on opposite sides of the main cell array to provide driving signals to select a cell of the main cell array.

23 Claims, 31 Drawing Sheets

E : electricfield
P : polarity

NON-VOLATILE FERROELECTRIC MEMORY

This application is a continuation-in-part of Ser. No. 09/240,887 Feb. 1, 1999.

BACKGROUND OF THE INVENTION

1. Field of the Invention

The present invention relates to a semiconductor memory, and more particularly, to a circuit for driving a nonvolatile ferroelectric memory.

2. Background of the Related Art

A ferroelectric random access memory (FRAM) has a data processing speed as fast, as a DRAM and conserves data even after the power is turned off. The FRAM includes capacitors similar to the DRAM, but the capacitors have a ferroelectric substance for utilizing the characteristic of a high residual polarization of the ferroelectric substance in which data is not lost even after eliminating an electric field applied thereto.

FIG. 1 illustrates a general hysteresis loop of a ferroelectric substance. As shown in the hysteresis loop in FIG. 1, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. The state in which a positive voltage is applied to a ferroelectric memory cell is a "c" state in FIG. 1, the state in which no voltage is applied thereafter is a "d" state. Opposite to this, if a negative voltage is applied to the ferroelectric memory cell, the state moves from the "d" to an "f" state, and the state in which no voltage is applied thereafter is an "a" state. If a positive voltage is applied again, the states moves to the "c" state via the "b" state. Thus, a data can be stored in stable states of "a" and "d". On the hysteresis loop, "c" and "d" states correspond to a binary logic value of "1", and "a" and "f" states correspond to a binary logic value "0".

FIG. 2 illustrates a unit cell of a background art ferroelectric memory having two unit cells. The unit cells of a background art ferroelectric memory are provided with a plurality of bitlines Bit_n, Bit_n+1 . . . formed in a direction, a wordline W/L formed in a direction crossing the bitline, a plateline P/L formed in the same direction with the wordline spaced therefrom, and unit cells C111, C112, . . . each formed between the bitlines, the wordline and the plateline. Each unit cell C111, C121, . . . is provided with a transistor T1 having a gate connected to the wordline and a source connected to the bitline, and a ferroelectric capacitor FC1 having a first terminal connected to a drain of the transistor T1 and a second terminal connected to the plateline.

FIGS. 3a and 3b together illustrate a circuit for driving the background art one transistor/one capacitor (1T/1C) ferroelectric memory of FIG. 2. A reference voltage generator 1 generates a reference voltage, and a reference voltage stabilizer 2 having a plurality of transistors Q1~Q4 and a capacitor C1 stabilizes a reference voltage on two adjacent bitlines B1 and B2 because the reference voltage from the reference voltage generating part 1 can not be provided to a sense amplifier directly. A first reference voltage storage part 3 having a plurality of transistors Q6~Q7 and capacitors C2~C3 stores a logic value "1" and a logic value "0" in adjacent bit lines. A first equalizer 4 having a transistor Q5 equalizes adjacent two bitlines.

A first main cell array 5 connected to wordlines W/L and platelines P/L different from one another stores data, and a first sense amplifier 6 having a plurality of transistors Q10~Q15 and P-sense amplifiers PSA senses a data in a cell selected by the wordline from the plurality of cells in the main cell array part 5. A second main cell array 7 connected to wordlines and platelines different from one another stores data, and a second reference voltage storage 8 having a plurality of transistors Q28~Q29 and capacitors C9~C10 stores a logic value "1" and a logic value "0" in adjacent bit lines. A second sense amplifier 9 having a plurality of transistors Q16~Q25 and N-sense amplifiers NSA senses a data in the second main cell array 7.

FIG. 4 illustrates a timing diagram showing a write mode operation of the background art ferroelectric memory. First, when a chip enable signal CSBpad received externally is enabled from "high" to "low" and a write enable signal WEBpad also transits from "high" to "low", the write mode is started. An address decoding is started in the write mode, to transit a pulse applied to a selected wordline from "low" to "high" to a selected cell. In an interval where the wordline is thus held at "high", a corresponding plateline P/L is applied of a "high" signal for an interval and a "low" signal for an interval in a sequence and a corresponding bitline is applied of a "high" or "low" signal synchronous to the write enable signal, for writing a logic "1" or "0" on the selected cell. In other words, if a signal applied to the plateline is "low" in an interval where the bitline is applied of a "high" signal and the wordline is applied of a "high" signal, a logic value "1" is written in the ferroelectric capacitor. If a signal applied to the plateline is "high" and the bitline is applied of a "low" signal, a logic value "0" is written in the ferroelectric capacitor.

The operation for reading a data stored in a cell with the write mode operation will be explained with reference to FIG. 5. When the chip enable signal CSBpad is enabled from "high" to "low" externally, all bitlines are equalized to "low" by an equalizer signal before selection of a corresponding wordline. As shown in FIGS. 3a and 3b, when a "high" signal is applied to the equalizer 4 and a "high" signal is applied to transistors Q18 and Q19, grounding the bitlines through transistors Q18 and Q19, the bitlines are equalized to a low voltage Vss. The transistors Q5, Q18 and Q19 are turned off, disabling corresponding bitlines, and address is decoded for transiting a corresponding wordline from "low" to "high", to select a corresponding cell. Then, a "high" signal is applied to a plateline of the selected cell, to cancel data corresponding to a logic value "1" stored in a FRAM. If the FRAM is in storage of a logic value "0", a data corresponding to it will not be canceled. A cell with a canceled data and a cell with a data not canceled provide signals different from each other according to the aforementioned hysteresis loop principle. Data provided through the bitline is sensed by the sense amplifier of a logic value "1" or "0".

That is, referring to FIG. 1, since the case of a canceled data is a case when a state is changed from "d" to "f", and the case of a data not canceled is a case when a state is changed from "a" to "f", if the sense amplifier is enabled after a certain time, in the case of the canceled data, the data is amplified to provide a logic value "1", and, in the case of the data not canceled, the data is amplified to provide a logic value "0". After the sense amplifier amplifies and provides a signal, since the cell should be recovered of an original data, during "high" is applied to a corresponding line, the plateline is disabled from "high" to "low". However, in the background art 1T/1C ferroelectric memory, since the reference cell operates more often than the main memory cell in data input and output operations, the reference cell degrades rapidly.

Accordingly, the background art ferroelectric memory has various disadvantages. Since one reference cell of a ferroelectric substance of which ferroelectric property is not fully assured is provided for several hundreds of main memories cells for use in reading operation, requiring much more operation of the reference cell, the reference cell experiences a rapid degradation of the ferroelectric property, causing instability of the reference voltage and subsequent degradation of device operation performance and life time.

SUMMARY OF THE INVENTION

An object of the present invention is to provide a non-volatile ferroelectric memory that substantially obviates one or more of the problems caused by limitations and disadvantages of the related art and to provide at least the advantages described hereinafter.

Another object of the present invention is to provide a memory having increased integration.

Another object of the present invention is to provide a non-volatile ferroelectric memory that improves operational characteristics such as reducing degradation of reference cells and increasing voltage stability.

Another object of the present invention is to provide a non-volatile ferroelectric memory having an increased lifetime.

To achieve at least these and other advantages in a whole or in parts and in accordance with the purpose of the present invention, as embodied and broadly described, the non-volatile ferroelectric memory includes main cell array having a plurality of sub cell arrays, a plurality of main global bitlines disposed to cross the sub cell arrays and at least one pair of reference global bitlines, main local bitlines and reference local bitlines formed in correspondence to the main global bitlines and the reference global bitlines, and switches provided between the local bitlines and a relevant global bitlines, a reference bitline controller having a reference sense amplifier formed above or below the main cell array for sensing a signal provided through one bitline of the one pair of reference global bitlines, to provide a reference voltage, a main bitline controller having a plurality of main sense amplifiers formed on one side of the reference bitline controller and connected to the main global bitlines respectively for receiving the reference voltage and forwarding through a relevant global bitline, a wordline driver formed on one side of the main cell array for providing a driving signal for selecting a cell, and a plateline driver formed on the other side of the main cell array for providing a driving signal for selecting a cell together with a driving signal of the wordline driver.

To achieve at least these and other advantages in a whole or in parts and in accordance with the purpose of the present invention, as embodied and broadly described, the non-volatile ferroelectric memory includes a cell array having a plurality of sub cell arrays, a plurality of global bitlines and at least one pair of reference global bitlines extending in a first direction to cross the sub cell arrays, local bitlines and reference local bitlines respectively corresponding to the global bitlines and the reference global bitlines that also extend in the first direction, wherein the local bitlines are located within a single corresponding sub cell array and are selectively coupled to corresponding global bitlines, a reference bitline controller having a reference sense amplifier that senses a signal provided through one of the at least one pair of reference global bitlines and outputs a reference voltage, a bitline controller having a plurality of sense amplifiers coupled to sense a signal provided through the global bitlines, respectively, wherein the sense amplifiers receive the reference voltage, a wordline driver on a first side of the cell array that provides a driving signal for selecting a cell, and a plateline driver on a second side of the cell array opposite from the first side of the wordline driver that provides a driving signal for selecting the cell, wherein the reference bitline controller is on a third side of the cell array between the first and second sides.

To achieve at least these and other advantages in a whole or in parts and in accordance with the purpose of the present invention, as embodied and broadly described, the non-volatile ferroelectric memory includes a cell array having a plurality of sub cell arrays, a plurality of global bitlines and at least one pair of reference global bitlines extending in a first direction to cross the sub cell arrays, local bitlines and reference local bitlines respectively corresponding to the global bitlines and the reference global bitlines that also extend in the first direction, and switches each disposed between one of the local bitlines and a corresponding global bitline, a first reference bitline controller of a first reference sense amplifier above the cell array that senses a signal provided through one of the at least one pair of reference global bitlines to provide a first reference voltage, a second reference bitline controller of a second reference sense amplifier below the cell array that provides a voltage substantially equal to the first reference voltage, a first bitline controller adjacent the first reference bitline controller coupled to even numbered global bitlines among the plurality of global bitlines for receiving the first reference voltage to sense a signal provided through the even numbered global bitlines, a second bitline controller adjacent the second reference bitline controller coupled to odd numbered global bitline among the plurality of global bitlines for receiving the second reference voltage to sense the signal provided through the odd numbered global bitline, a wordline driver on one side of the cell array that provides a first driving signal for selecting a cell, and a plateline driver on the opposite side of the cell array from the wordline driver that provides a second driving signal for selecting the cell.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
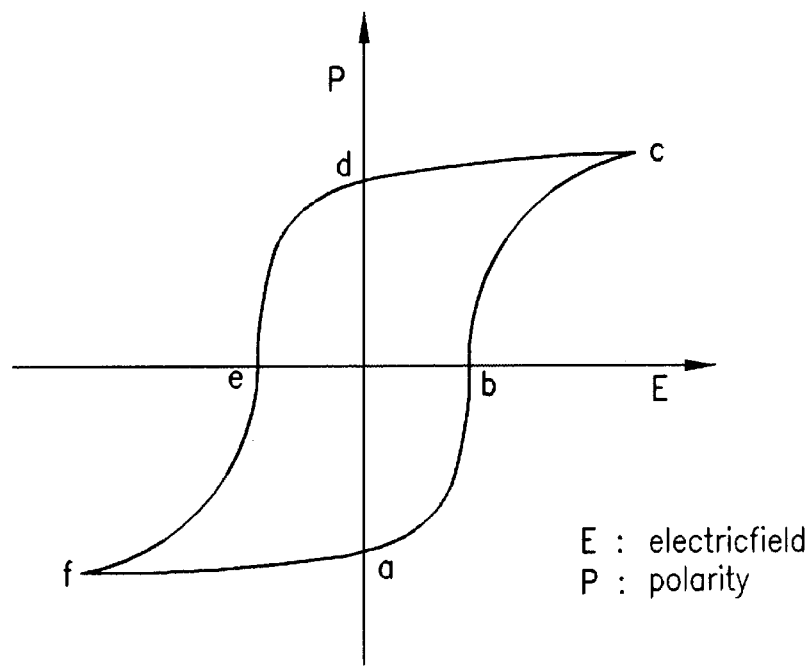
FIG. 1 is a diagram that illustrates a characteristic curve of a hysteresis loop of a ferroelectric material.
Figure 2:
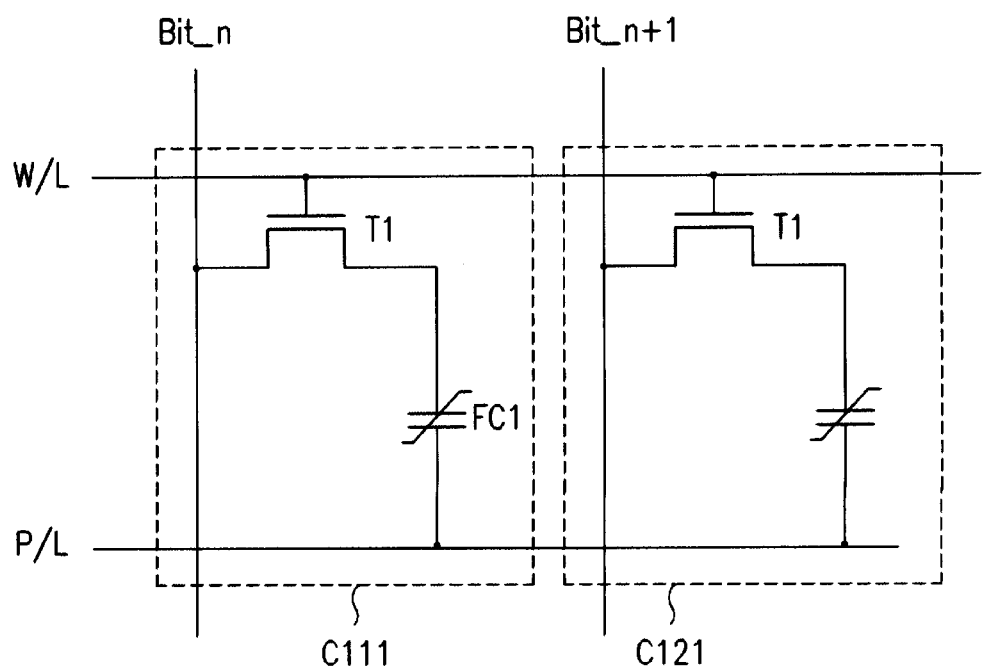
FIG. 2 is a diagram that illustrates a system of a related art non-volatile ferroelectric memory.
Figure 3A:
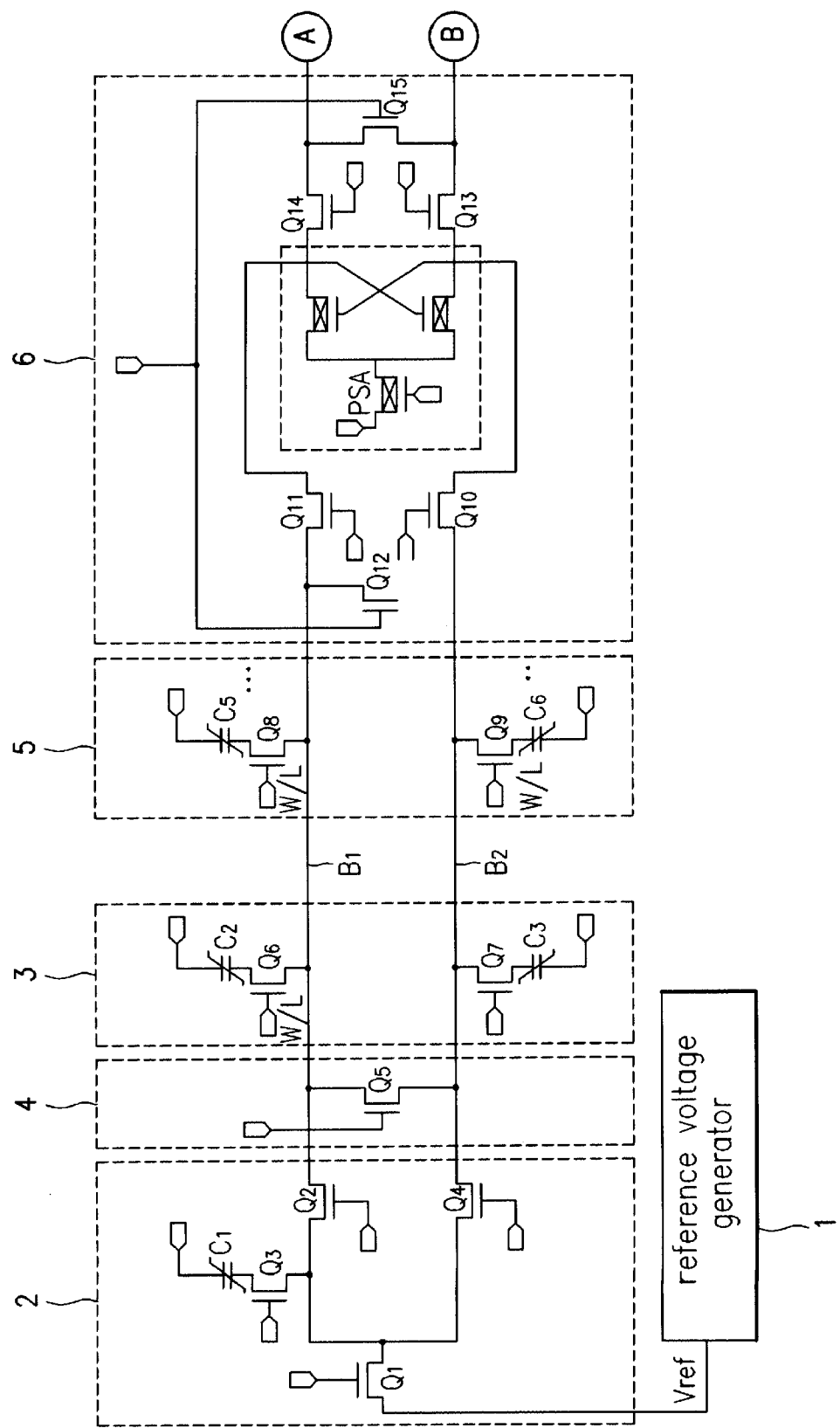
FIGS. 3a and 3b are diagrams that illustrate a circuit for driving the related art ferroelectric memory of FIG. 2.
Figure 3B:
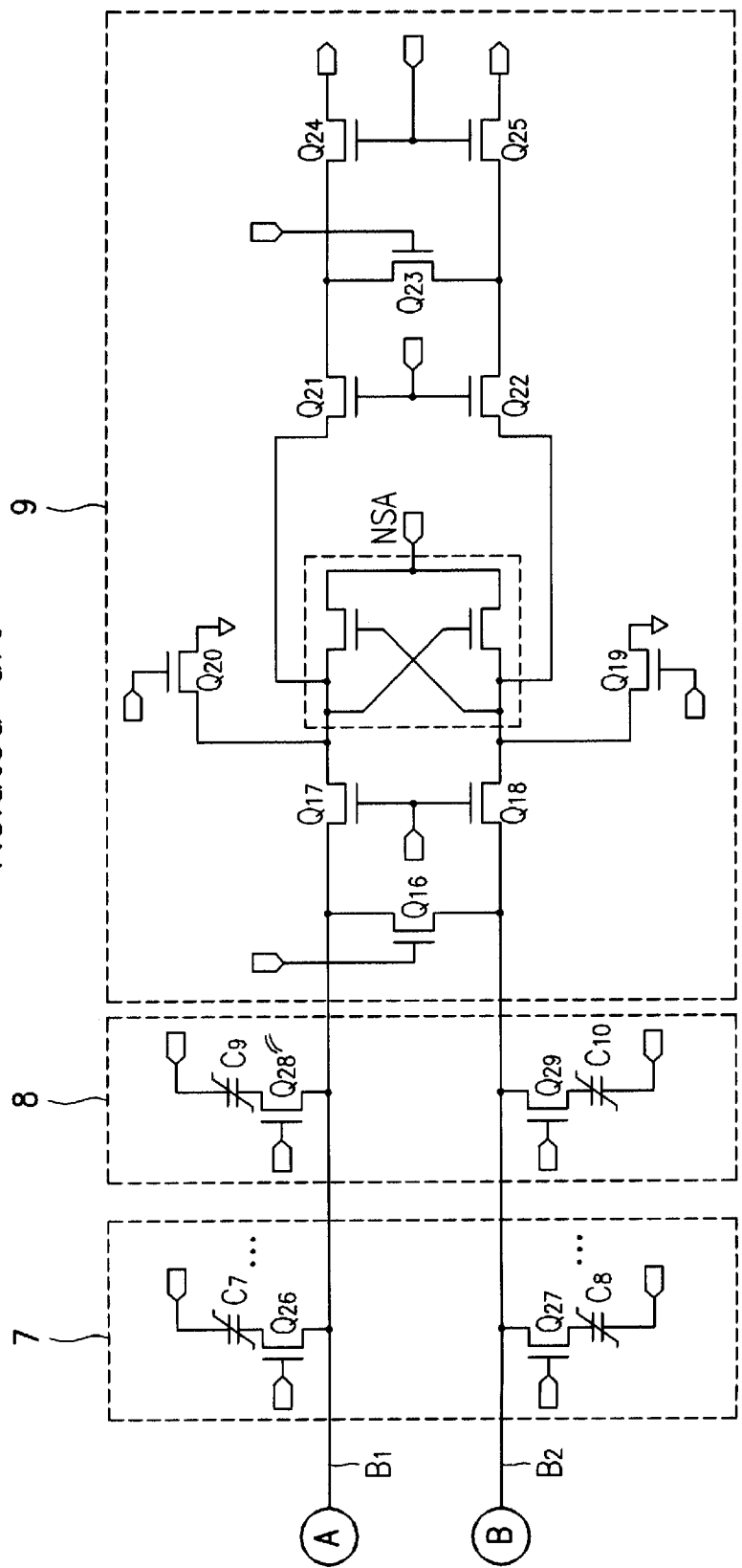
Figure 4:
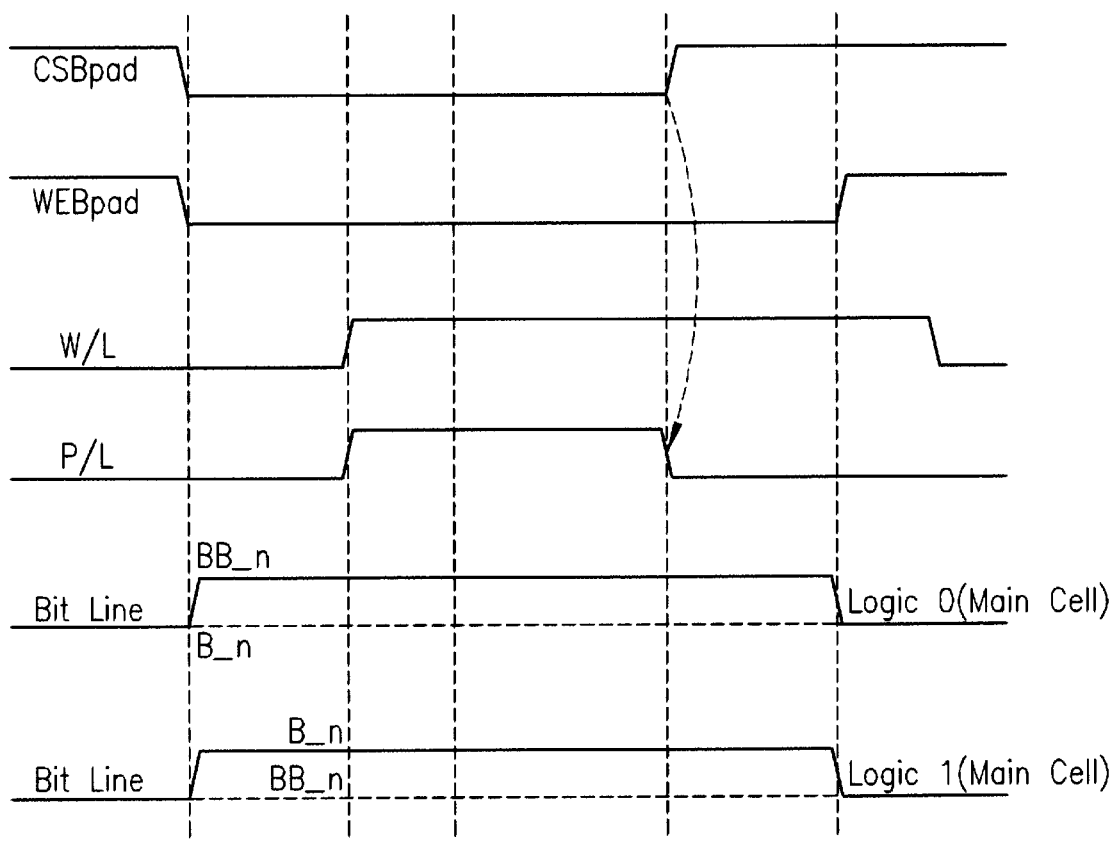
FIG. 4 is a diagram that illustrates timing of a write mode operation of the related art ferroelectric memory.
Figure 5:
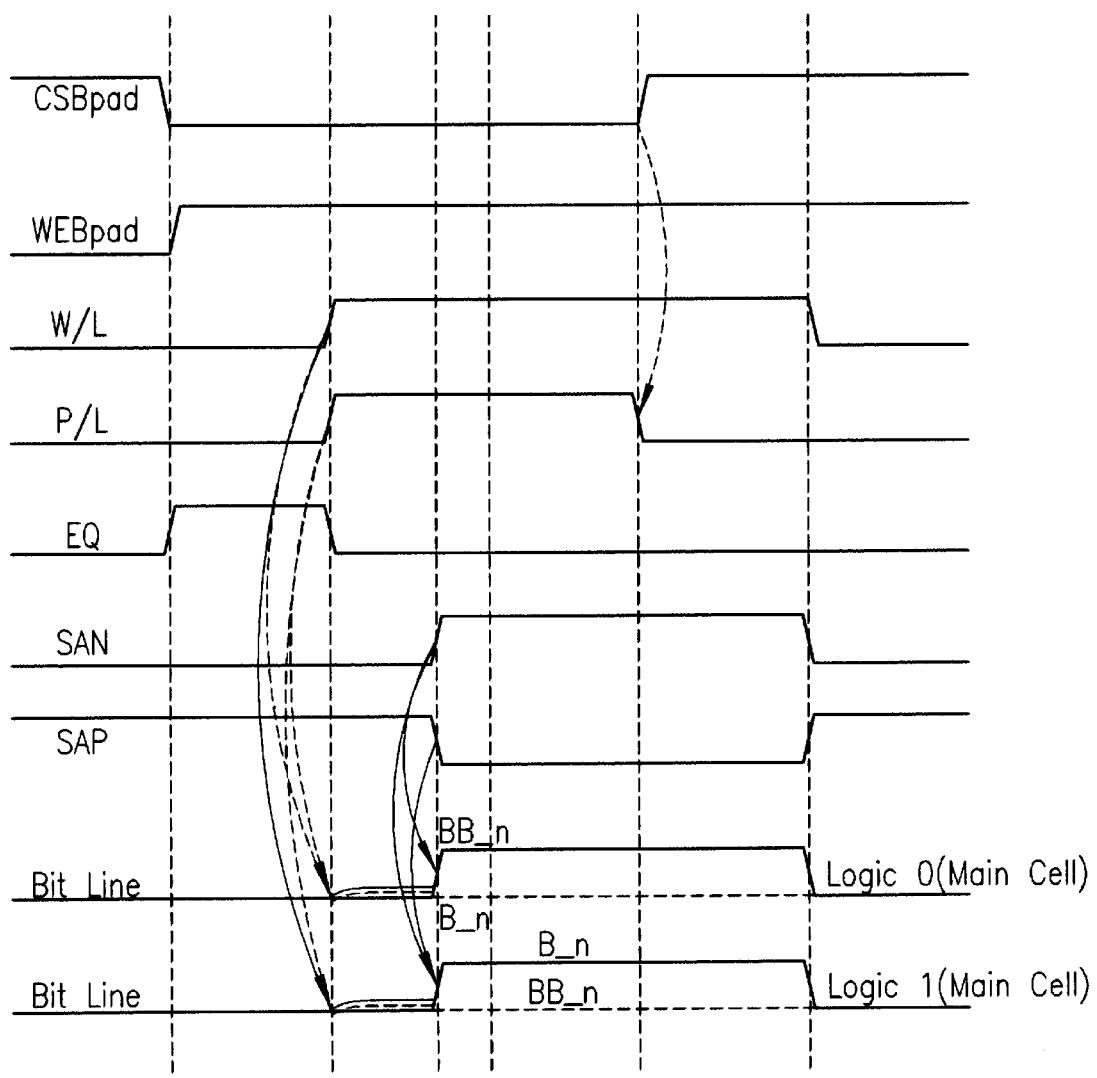
FIG. 5 is a diagram that illustrates timing of a read mode operation of the related art ferroelectric memory.
Figure 6:
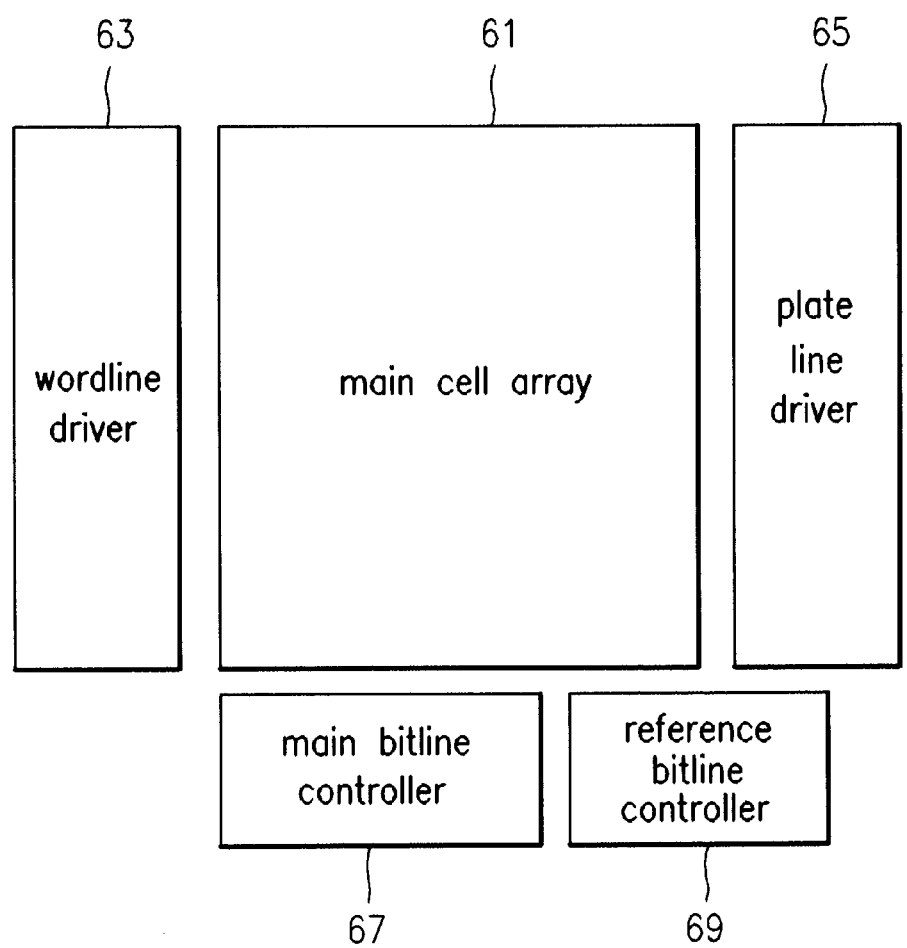
FIG. 6 is a diagram that illustrates a system of cell array of a non-volatile ferroelectric memory in accordance with a first preferred embodiment of the present invention.
Figure 7:
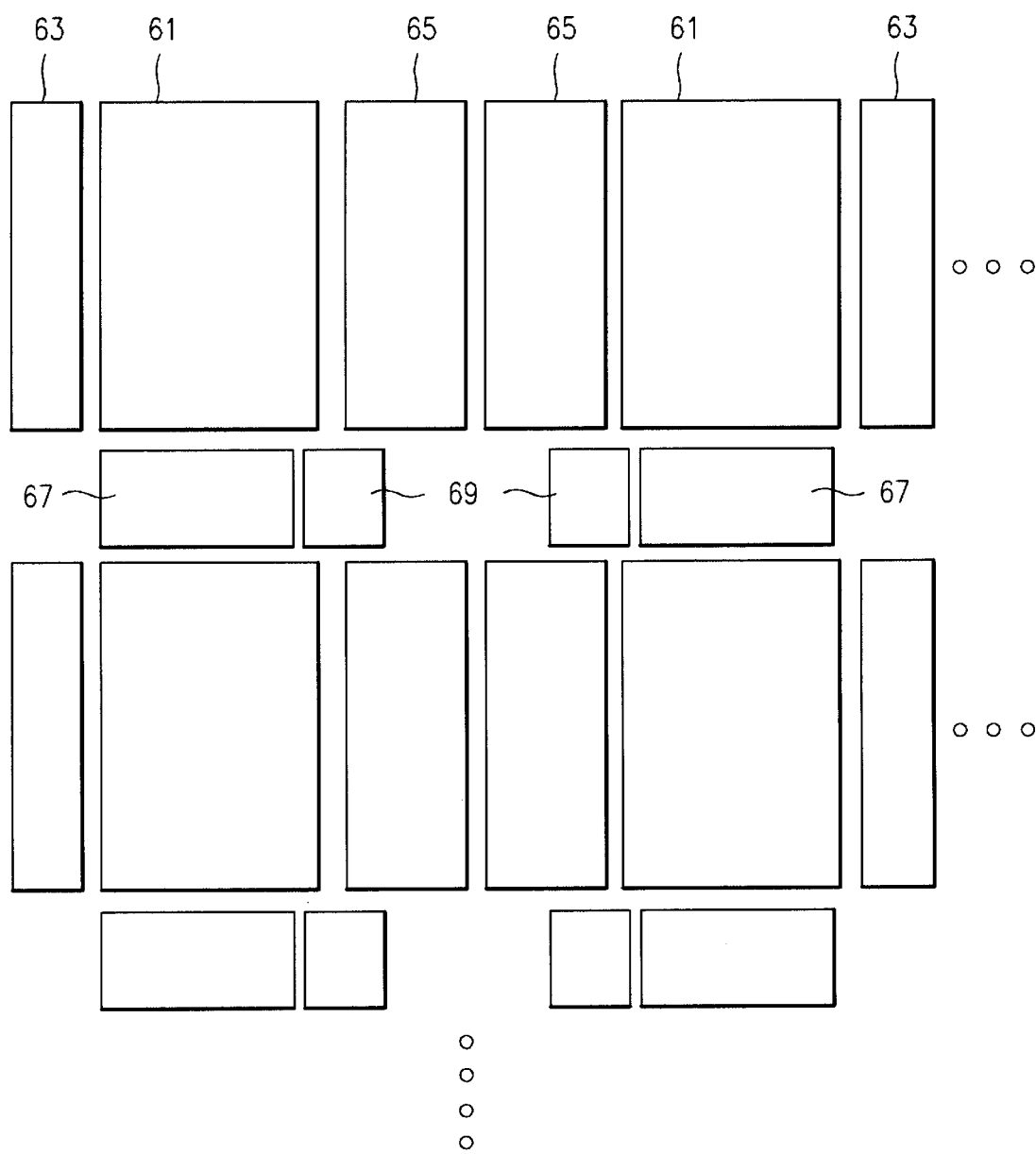
FIG. 7 is a diagram that illustrates a block diagram of a cell array when the system of the cell array in FIG. 6 is repeated.

FIG. 6 is a diagram that illustrates a non-volatile ferroelectric memory in accordance with a first preferred embodiment of the present invention. Referring to FIG. 6, a cell array of a non-volatile ferroelectric memory in accordance with the first preferred embodiment of the present invention includes a main cell array 61, a wordline driver 63 on one side of the main cell array 61, a plateline driver 65 on the other side of the main cell array 61, a main bitline controller 67 under the main cell array 61, and a reference bitline controller 68 on the other side of the main bitline controller 67. The main cell array 61 includes a plurality of cell arrays. Selected repetition of the system in FIG. 6 preferably forms a system as shown in FIG. 7.

Figure 8:
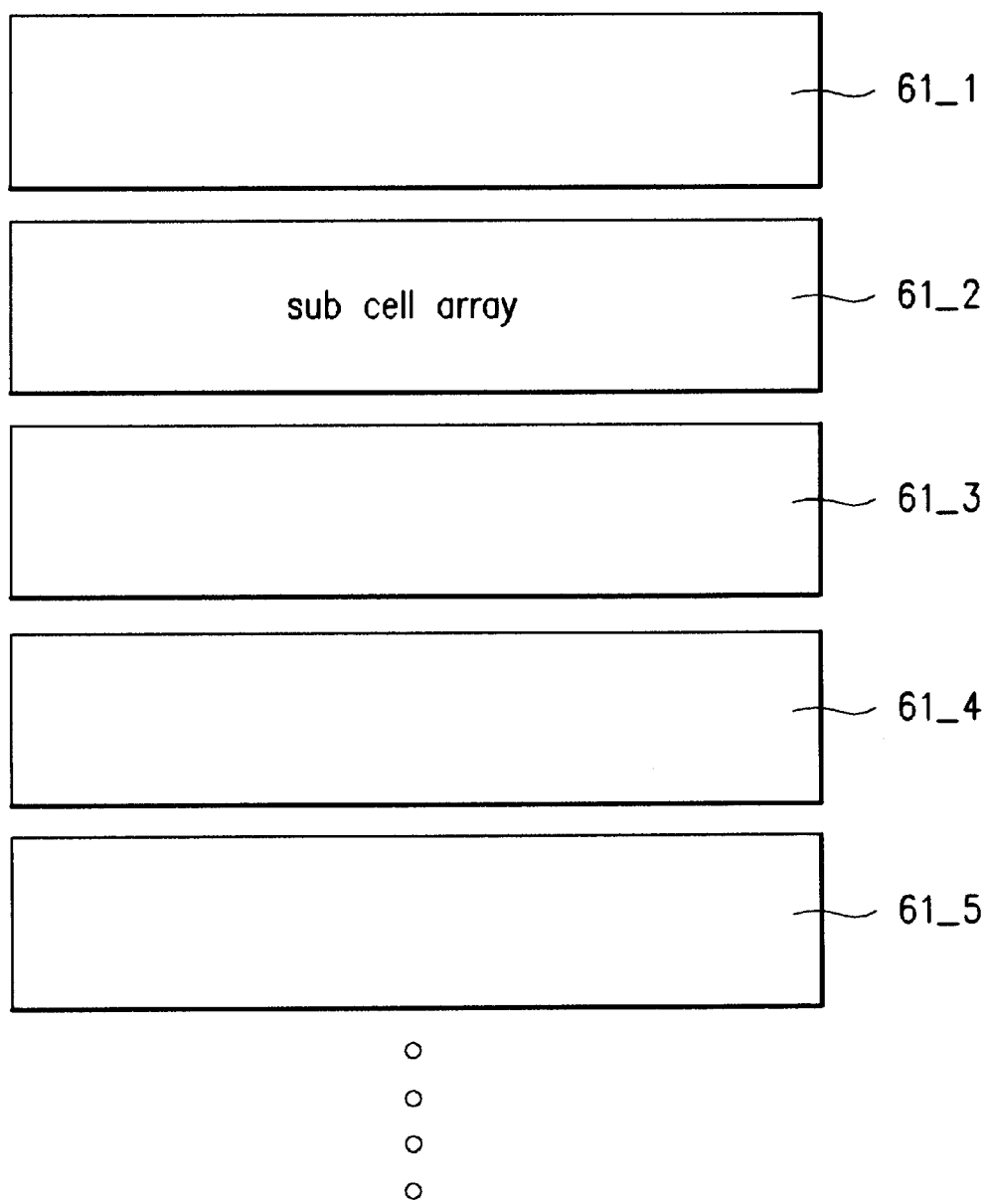
FIG. 8 is a diagram that illustrates a system of a main cell array having a plurality of sub cell arrays.

FIG. 8 is a diagram that illustrates additional detail of a main cell array according to the present invention, which has a plurality of cell arrays (hereafter called as "sub cell arrays"). Thus, as shown in FIG. 8 the main cell array includes sub cell arrays $61\_1, 61\_2, 61\_3, \ldots, 61\_n$ where no two sub cell arrays are enabled at the same time.

Figure 9:
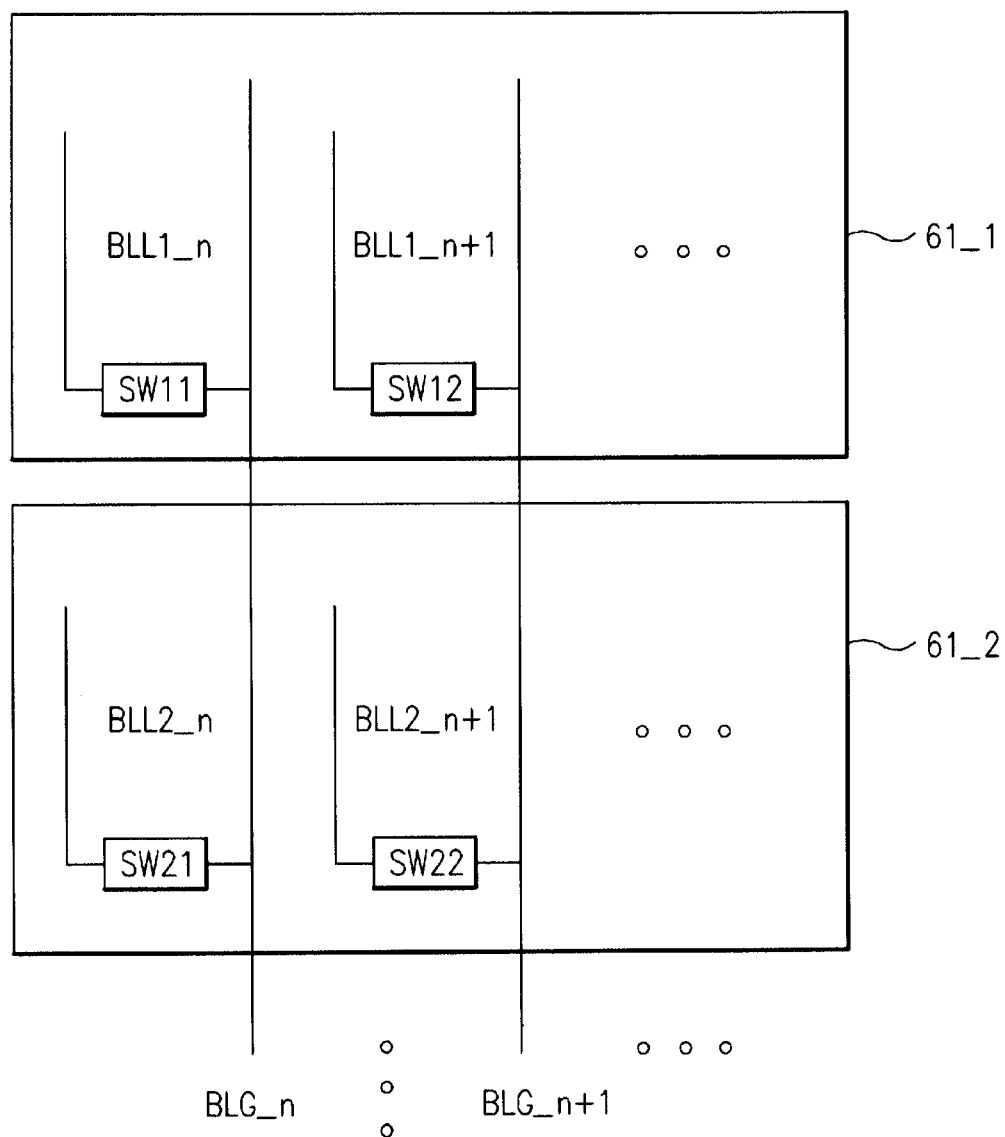
FIG. 9 is a diagram that illustrates a system of the main cell array in FIG. 6.

FIG. 9 is a diagram that illustrates additional detail of the system shown in FIG. 8. Referring to FIG. 9, a plurality of global bitlines $BLG\_n, BLG\_n+1, \ldots$ are provided across the sub cell arrays $61\_1, 61\_2, \ldots$. Local bitlines $BLL1\_n, BLL2\_n, \ldots, BLLn\_n$ are provided in correspondence to the global bitlines $BLG\_n, BLG\_n+1, \ldots$ in each of the sub cell arrays $61\_1, 61\_2, \ldots$. Switches (SW11, SW12, ..., SW1n)(SW21, SW22, ..., SW2n) (SW31, SW32, ..., SW3n) are preferably provided between each local bitline and the corresponding global bitline to electrically couple connection of the local bitlines to the global bitline.

Figure 10:
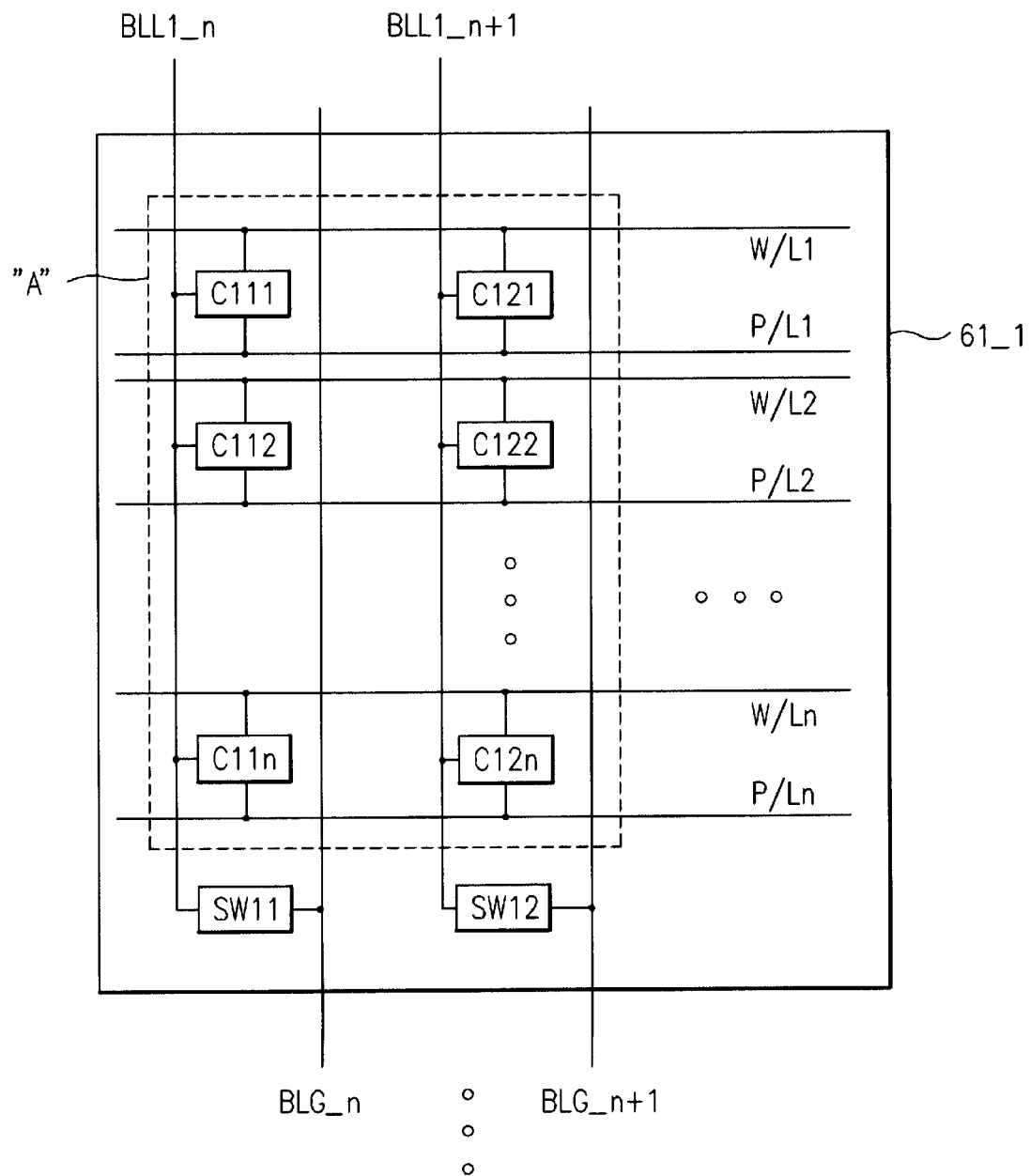
FIG. 10 is a diagram that illustrates a main cell array in FIG. 6.

FIG. 10 is a diagram that illustrates additional detail of one exemplary sub cell array. Referring to FIG. 10, wordline pairs of a wordline W/L and a plateline P/L are repeatedly provided in the sub cell array. The plurality of global bitlines $BLG\_n, BLG\_n+1, \ldots$ are provided perpendicular to the wordline and plateline W/L1, P/L1, ..., W/Ln, P/Ln pairs. A unit cell C111, C112, ..., C11n/C121, C122, ..., C12n/.../C1n1, C1n2, ..., C1nn is coupled to every local bitline perpendicular to the wordline W/L and plateline P/L pairs. There is a switch between a final end of the local bitline and a relevant global bitline, for transmission of a data of a cell selected from a plurality of cells coupled to the local bitline.

Operations for selecting a cell from the sub cell array will now be described. The main cell array includes a plurality of repetitive sub cell arrays as shown in FIG. 10. Only one sub cell array of the plurality of sub cell arrays is concurrently enabled, and, specifically, only one pair of the wordline W/L and the plateline P/L pairs is enabled. Consequently, if one pair of the wordline W/L and the plateline P/L is enabled, the unit cell coupled to the enabled wordline W/L and plateline P/L forwards a data to a relevant global bitline through a relevant local bitline. The global bitline forwards the cell data transmitted from the local bitline through a switch to the bitline controller (not shown). The bitline controller has sense amplifiers (not shown) coupled to the global bitlines respectively to forward only one data from one sense amplifier out of the plurality of sense amplifiers to outside the cell array through a dataline.

Figure 11:
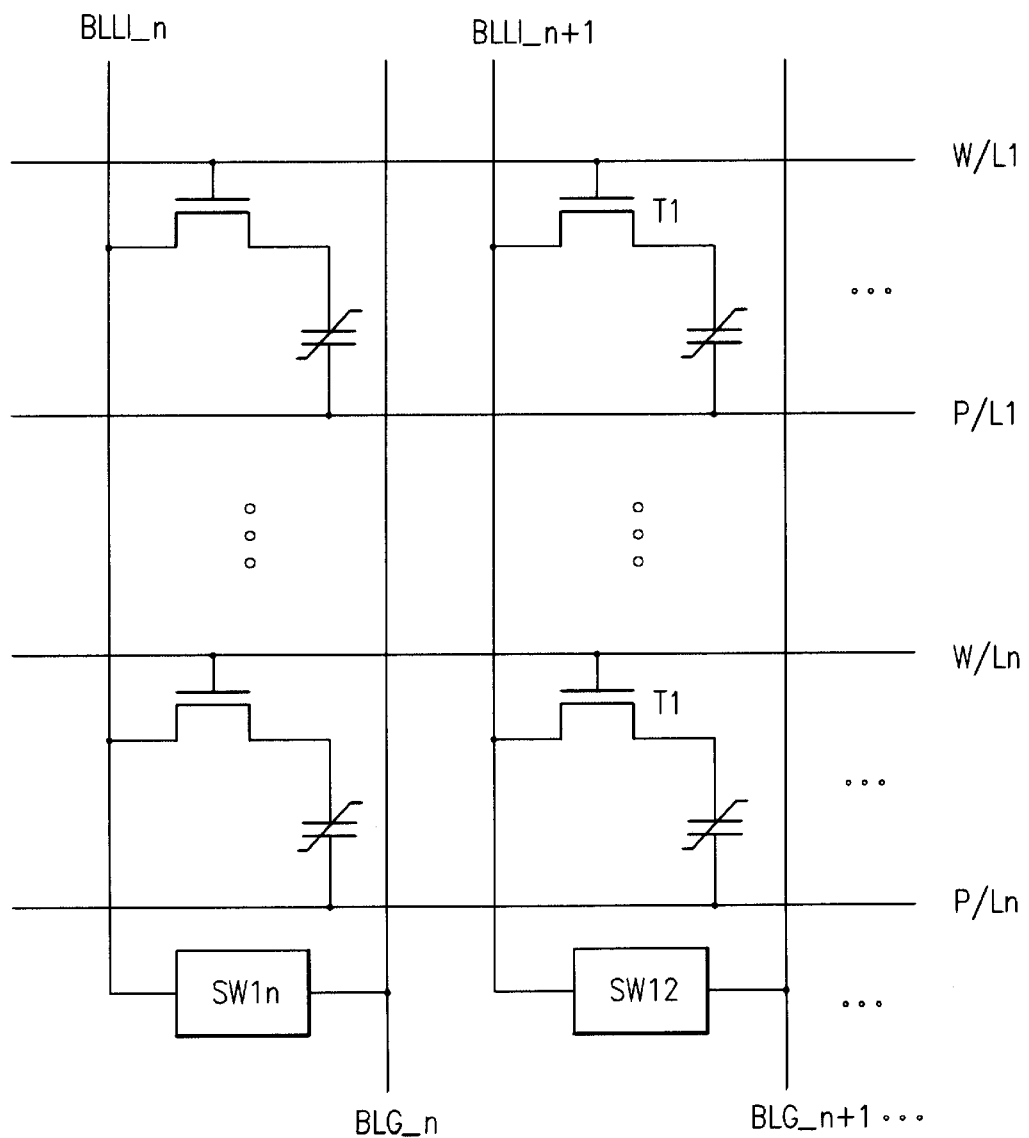
FIG. 11 is a diagram that illustrates an enlarged view of "A" part in FIG. 10.

FIG. 11 is a diagram that illustrates an enlarged view of "A" part in FIG. 10. As shown in FIG. 11 a unit cell is provided between the wordline W/L, the plateline P/L, and the local bitlines, and the switch is coupled between an end of the local bitline and the global bitline. The unit cell has one transistor with a gate coupled to a relevant wordline and one ferroelectric capacitor with one terminal of two terminals coupled to a drain (or a source) of the transistor and the other terminal coupled to a relevant plateline.

Figure 12:
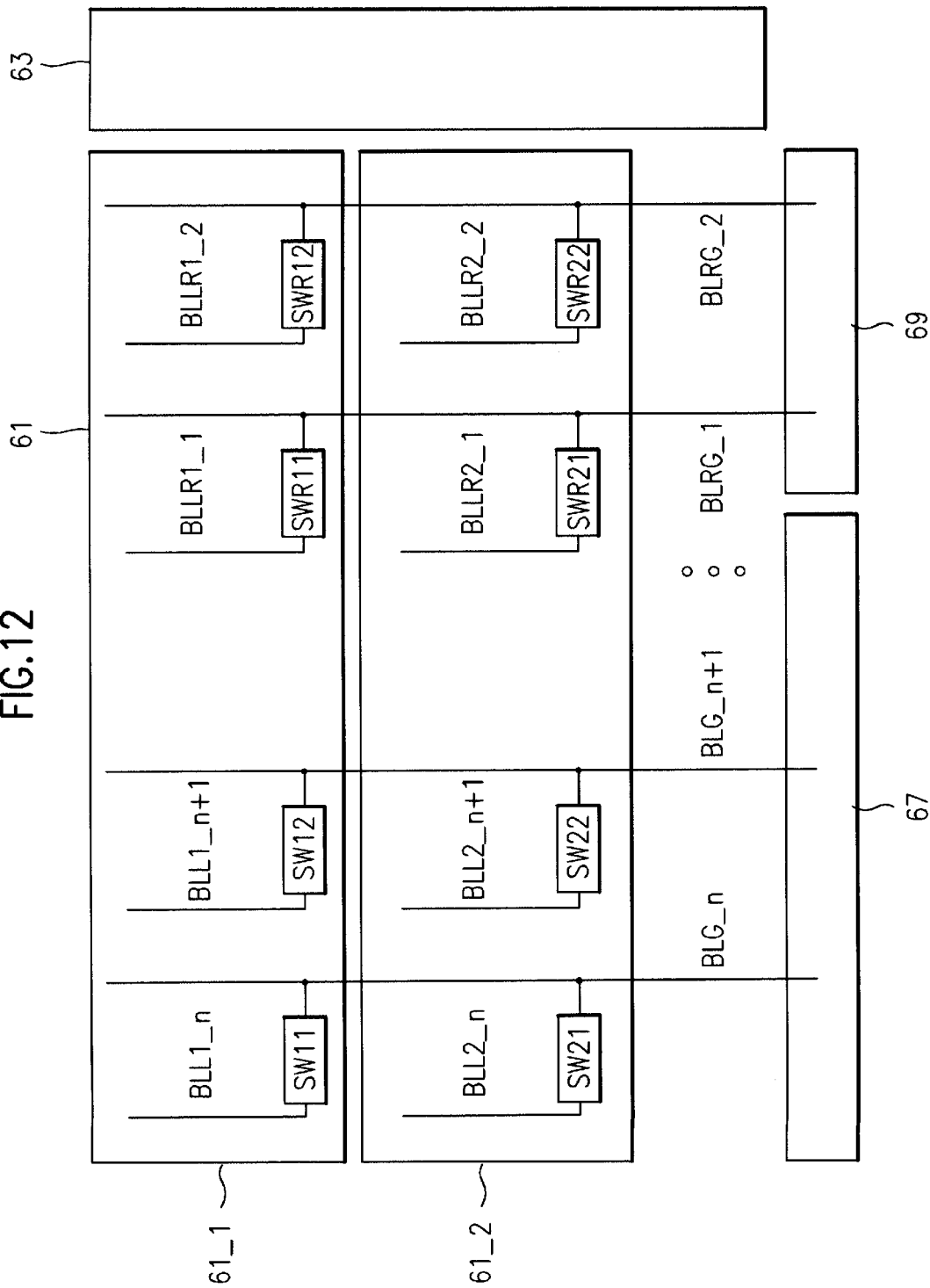
FIG. 12 is a diagram that illustrates a block diagram in FIG. 6 centered on a main cell array, a main bitline controller and a reference bitline controller.

FIG. 12 is a diagram that illustrates additional detail of the block diagram in FIG. 6 centered on the main cell array 61, the main bitline controller 67 and the reference bitline controller 69. Referring to FIG. 12, the main cell array 61 has a plurality of sub cell arrays 61_1, 61_2, . . . . The main global bitlines BLG_n, BLG_n+1 . . . crossing the sub cell arrays 61_1, 61_2, . . . are coupled to a main bitline controller 67, and reference global bitlines BLRG_1, BLRG_2 are coupled to the reference bitline controller 69. The reference bitline controller 69 preferably has two reference global bitlines BLRG , and BLRG2. As shown in FIG. 12, each sub cell array preferably has a main local bitline provided therein to correspond to the main global bitline. For example, a first main global bitline BLG-n has a plurality of main local bitlines BLL1-n, BLL2-n, . . . . Switches SW11, SW21, . . . are provided between main local bitlines and main global bitlines, respectively. There are reference local bitlines BLLR1_1, BLLR2_1, . . . /BLLR1_2, BLLR2_2, . . . / . . . /BLLR1_n, BLLR2_n provided in correspondence to the reference global bitlines BLRG_1, BLRG_2. Switches SWR11, SWR21 /SWR12, SWR22/. . . /SWR1n, SWR2n, . . . are provided between the reference local bitlines and the reference global bitlines BLRG_1, BLRG_2. Therefore, one sub cell array is selected from the sub cell arrays 61_1, 61_2, . . . , the main local bitline of the selected sub cell array is coupled to the main global bitline, thereby transmitting a data to the main bitline controller 67. Similarly, the reference local bitline in the selected sub cell array is coupled to a relevant reference global bitline, thereby transmitting a data to the reference bitline controller 69.

Figure 13:
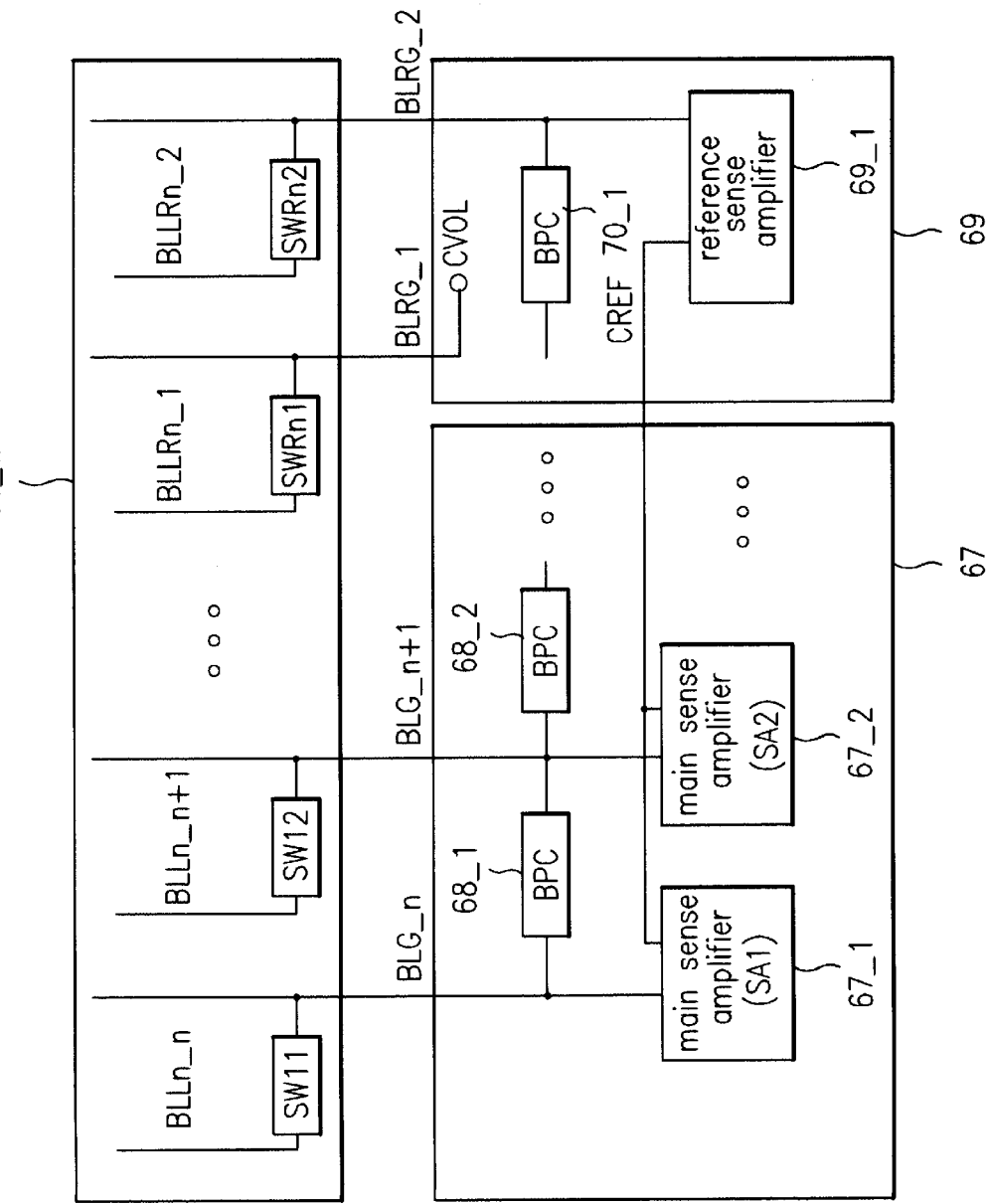
FIG. 13 is a diagram that illustrates a block diagram in FIG. 6 centered on a main bitline controller and a reference bitline controller.

FIG. 13 is a diagram that illustrates additional detail of the block diagram in FIG. 6 centered on a main bitline controller and a reference bitline controller. Referring to FIG. 13, the main sense amplifiers SA1, SA2, . . . , 67_1, 67_2, . . . are coupled to the main global bitlines BLG_n, BLG_n+1, . . . , respectively. One of two reference global bitlines BLRG_1, BLRG_2 is coupled to a reference sense amplifier 69-1, such that a reference voltage CREF from the reference sense amplifier 69_1 is commonly applied to the main sense amplifiers 67_1, 67_2, . . . . There are Bitline Precharge Circuits (BPC) 68_1, 68_2, . . . between adjacent main global bitlines BLG_n and BLG_n+1, or BLG_n+1 and BLG_n+2, . . . . There is also a bitline precharge circuit 70_1 provided between a last main global bitline BLG_n+n and the reference global bitline BLRG_2 coupled to the reference sense amplifier 69_1. A constant voltage is applied to one of the reference global bitlines (i.e., BLRG_1), which is not coupled to the reference sense amplifier 69_1.

Figure 14:
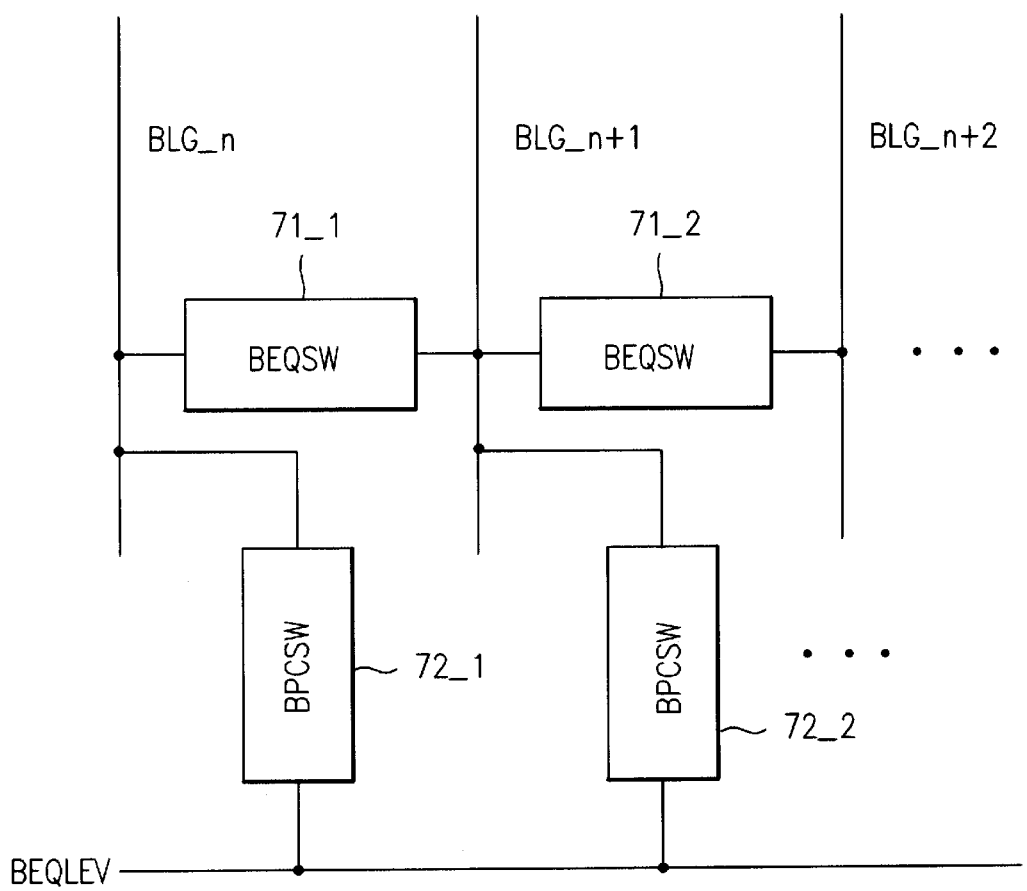
FIG. 14 is a diagram that illustrates a preferred embodiment of a bitline pre-charge circuit in accordance with the present invention.

FIG. 14 is a diagram that illustrates a first preferred embodiment of a bitline precharge circuit in accordance with the present invention. Referring to FIG. 14, the bitline pre-charge circuit includes a plurality of global bitlines BLG_n, BLG_n+1, . . . , a bitline equalizing switch BEQSW 71_1, 71_2, . . . provided between adjacent global bitlines BLG_n, BLG_n+1, . . . , and a plurality of Bitline Precharge Switches (BPCSWs) 72_1, 72_2, . . . for switching a signal BEQLEV from a bitline precharge level supplier (not shown) to the global bitlines BLG_n, BLG_n+1, . . . The bitline equalizing switches 71_1, 71_2, . . . or the bitline precharge switches 72_1, 72_2, . . . preferably have an NMOS transistor. Therefore, a level of the signal from the bitline precharge level supplier is equal to or slightly higher than a threshold voltage of the NMOS transistor. Ultimately, the signal from the bitline precharge level supplier pre-charges a level of a relevant global bitline through the bitline precharge switches 72_1, 72_2. . . . The bitline equalizing switches 71_1, 71_2, . . . , which are turned on in response to a switch control signal, equalize two adjacent global bitlines to the same level.

Figure 15A:
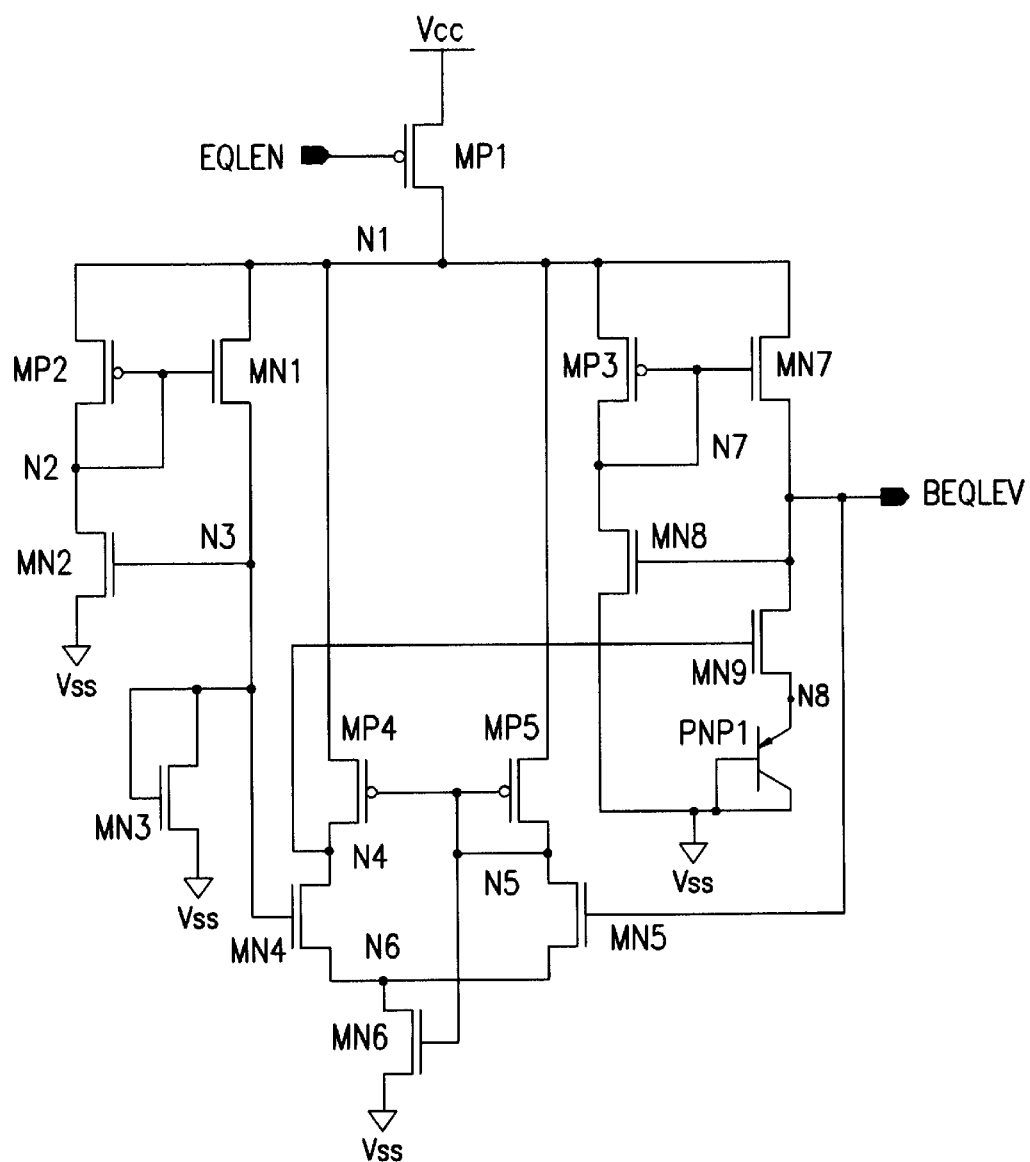
FIG. 15a is a diagram that illustrates a first preferred embodiment of a bitline pre-charge level supplier in accordance with the present invention.

FIG. 15a is a diagram that illustrates a first preferred embodiment of a bitline precharge level supplier in accordance with the present invention. Referring to FIG. 15a, the bitline precharge level supplier includes a first PMOS transistor MP1 having a source coupled to a power source Vcc and adapted to be controlled in response to an enabling signal EQLEN for use in enabling the bitline precharge level supplier. A second PMOS transistor MP2 has a source coupled to a drain of the first PMOS transistor MP1 and a drain and a gate coupled together. A first NMOS transistor MN1 is coupled in parallel with respect to the drain of the first PMOS transistor MP1 together with the second PMOS transistor MP2 and has a gate coupled to the gate of the second PMOS transistor MP2. A second NMOS transistor MN2 is coupled in series to the second PMOS transistor MP2 and has a gate coupled to the drain of the second PMOS transistor MP2, and a third NMOS transistor MN3 has a gate and a drain coupled together and coupled to the drain of the first NMOS transistor MN1 and a source coupled to a ground terminal Vss. A fourth NMOS transistor MN4 has a gate coupled to the drain of the first NMOS transistor MN1 and is adapted to be controlled by the drain voltage. A fifth NMOS transistor MN5 is disposed at a position opposite to the fourth NMOS transistor MN4 and has a drain coupled to the drain of the fourth NMOS transistor MN4, and a sixth NMOS transistor MN6 has a drain coupled to the common drain of the fourth and fifth NMOS transistors MN4 and MN5 and a source coupled to a ground terminal Vss. A fourth PMOS transistor MP4 is coupled between the source of the fourth NMOS transistor MN4 and the drain of the first PMOS transistor MP1, and a fifth PMOS transistor MP5 is coupled between the source of the fifth NMOS transistor MN5 and the drain of the first PMOS transistor MP1 and has a gate coupled to the gate of the fourth PMOS transistor MP4. A third PMOS transistor MP3 is coupled in parallel with respect to the drain of the first PMOS transistor MP1 together with the first NMOS transistor MN1 and has a drain and a gate coupled together. A seventh NMOS transistor MN7 is disposed at a position opposite to the third PMOS transistor MP3 and has a gate coupled to the gate of the third PMOS transistor MP3, and an eighth NMOS transistor MN8 has a gate coupled to the drain of the seventh NMOS transistor MN7 and a source coupled to the drain of the third PMOS transistor MP3. A ninth NMOS transistor MN9 is controlled in response to a drain voltage of the fourth PMOS transistor MP4 and coupled in series to the seventh NMOS transistor MP7, and a bipolar transistor PNP1 has an emitter coupled to the drain of the ninth NMOS transistor MN9 and having a collector and a base coupled to a ground terminal in common. The fifth NMOS transistor MN5 is controlled by a bitline precharge voltage that precharges bitlines.

Operations of the first preferred embodiment of the bitline precharge level supplier will now be described. Referring to FIG. 15a, when the enable signal for enabling the bitline precharge level supplier is transited to low in a regular operation, the first PMOS MP1 is enabled to elevate a potential at a node N1 to a high level. If a voltage on a drain side of the second NMOS transistor MN2, i.e., at a node N2 is low, the second PMOS transistor MP2 is turned on, to elevate a level of the node N2, too. Therefore, the first NMOS transistor MN1 having the gate coupled to the node N2, is turned on, to elevate a level of a node N3. Once the level of the node N3 is elevated over a threshold voltage of the third NMOS transistor MN3, the third NMOS transistor MN3 is turned on to discharge current to a ground terminal, which fixes the level of the node N3 to the threshold voltage. As the level of the node N3 turns on the second NMOS transistor MN2, a level of the node N2 is slowly dropped. Once the level of the node N2 is dropped, a turning-on resistance of the first NMOS transistor MN1 is increased to reduce a current fed to the node N3. Eventually, a voltage at the node N3 at a level of a threshold voltage can be obtained at steady state using the first NMOS transistor MN1 and the second PMOS transistor MP2, and a feed back loop of the second NMOS transistor MN2 and the third NMOS transistor MN3. If a node N7 is low at an initial stage, the third PMOS transistor MP3 is turned on to elevate a level of the node N7. When the level of the node N7 is elevated higher than the threshold voltage of the seventh NMOS transistor MN7, the seventh NMOS transistor MN7 is turned on, which discharges current to the ground terminal Vss through the bipolar transistor PNP1 coupled to a node N8. In FIG. 15a, the bipolar transistor PNP1 is of a PNP type. At the end, a level of an output terminal of the bitline precharge level supplier is fixed to a level of the threshold voltage substantially identical to the level at the node N3. The bipolar transistor PNP1, having a collector and a base coupled to the ground terminal Vss in common and an emitter coupled to the node N8, serves as a PN diode. The output terminal on the bitline precharge level supplier held at a threshold level turns on the eighth NMOS transistor MN8, dropping a voltage at the node N7. When the voltage at the node N7 drops with a corresponding increased turn-on resistance of the seventh NMOS transistor MN7, current applied to the output terminal on the bitline precharge level supplier is reduced. Eventually, a voltage of a threshold voltage level can be provided using a feed-back loop of the bipolar transistor PNP1, inclusive of the seventh, eighth, ninth NMOS transistors MN7, MN8 and MN9, the third PMOS transistor MP3, and a PN diode. Since the fourth, fifth, sixth NMOS transistors MN4, MN5 and MN6, and the fourth and fifth PMOS transistors MP4 and MP5 form an amplifier, an output of the node N4 is amplified according to an input to the fourth and fifth NMOS transistors MN4 and MN5.

In the first preferred embodiment of the bitline precharge level supplier according to the present invention, equalizing the voltage at the node N3 with a voltage at an output terminal (an output of the bitline precharge level supplier) will now be described. The voltage at the node N3 is provided to the gate of the fourth NMOS transistor MN4, and a voltage at the output terminal is provided to the gate of the fifth NMOS transistor MN5. If the voltage at the node N3 is higher than the voltage at the output terminal, a voltage at the node N4 is dropped and a voltage at the node N5 is boosted. The dropped voltage at the node N4 fed back to the ninth NMOS transistor MN9 increases a turning on resistance of the ninth NMOS transistor MN9, with a corresponding reduction in current discharged to the output terminal, and a level of the output terminal is elevated at the end. If a voltage at the node N3 is lower than the voltage at the output terminal, a voltage at the node N5 is reduced, and a voltage at the node N4 is increased. The increased voltage at the node N4 fed back to the ninth NMOS transistor MN9 drops a turning on resistance of the ninth NMOS transistor MN9, with a corresponding increase in the current discharged through the output terminal, and a level of the output terminal is reduced at the end. To prevent an excessive drop of the level of the output terminal, the bipolar transistor PNP1, which is operative as a PN diode, is provided between the node N8 and the ground terminal Vss for turning off the PN diode at a voltage below a threshold voltage of the PN diode to prevent discharge of any more current.

Figure 15B:
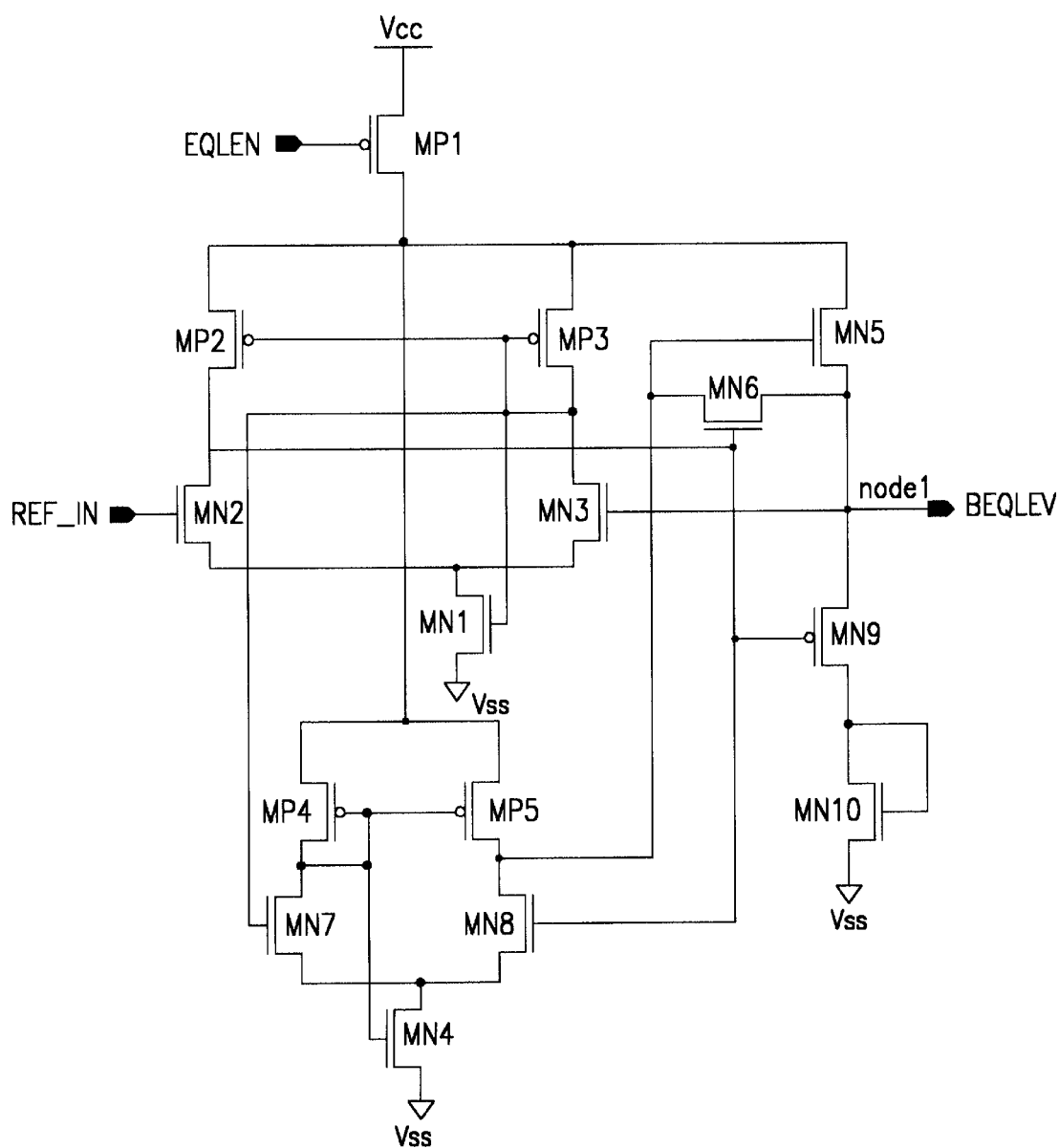
FIG. 15b is a diagram that illustrates a second preferred embodiment of a bitline pre-charge level supplier in accordance with the present invention.

FIG. 15b is a diagram that illustrates a second preferred embodiment of a bitline pre-charge level supplier in accordance with the present invention. Referring to FIG. 15b, the second preferred embodiment of the bitline pre-charge level supplier in accordance with the present invention includes a first PMOS transistor MP1 having a source coupled to a power source Vcc and adapted to be controlled by an enable signal EQLEN for enabling the bitline precharge level supplier, a second PMOS transistor MP2 and a third PMOS transistor MP3 each have a source coupled to a drain of the first PMOS transistor MP1 and a gate coupled together. A first NMOS transistor MN1 is controlled by a drain voltage of the third PMOS transistor MP3 for providing a ground voltage selectively, a second NMOS transistor MN2 is coupled between the second PMOS transistor MP2 and the first NMOS transistor NM1 and adapted to be controlled by an external reference voltage REF_IN, and a third NMOS transistor MN3 is coupled between the third PMOS transistor MP3 and the first NMOS transistor MN1 and adapted to be controlled by an output terminal (node 1) voltage. A fourth PMOS transistor MP4 and a fifth PMOS transistor MP5 each have a gate coupled to a source of the first PMOS transistor MP1 and a gate coupled together. A fourth NMOS transistor MN4 is adapted to be controlled by gate voltages of the fourth PMOS transistor MP4 and the fifth PMOS transistor MP5 for selectively providing a ground voltage. A fifth NMOS transistor MN5 has a source coupled to a drain of the first PMOS transistor MP1 and is adapted to be controlled by a drain voltage of the fifth PMOS transistor MP5, and a sixth NMOS transistor MN6 is coupled between a gate and a drain of the fifth NMOS transistor MN5 and is adapted to be controlled by a drain voltage of the second NMOS transistor MN2. A seventh NMOS transistor MN7 is adapted to be controlled by a drain voltage of the third PMOS transistor MP3 and coupled between the fourth PMOS transistor MP4 and the fourth NMOS transistor NM4. An eighth NMOS transistor NM8 is adapted to be controlled by a drain voltage of the second NMOS transistor MN2 and is coupled between the fifth PMOS transistor MP5 and the fourth NMOS transistor MN4. A ninth NMOS transistor NM9 is controlled by a drain voltage of the second NMOS transistor MN2 and has a drain coupled to the output terminal (node 1), and a tenth transistor NM10 is coupled between a source of the ninth NMOS transistor NM9 and a ground terminal Vss with its gate and drain coupled together. Each of the third PMOS transistor MP3 and the fourth PMOS transistor MP4 preferably has a drain and a gate coupled together.

The second preferred embodiment of the bitline precharge level supplier in accordance with the present invention compares an external reference voltage and a voltage at an output terminal (node 1) as shown in FIG. 15b and causes a level of the output terminal to always be constant. The level of the output terminal, which can be vulnerable to variation because the output terminal is coupled to the bitline, is stabilized by providing the second preferred embodiment of the bitline pre-charge level supplier according to the present invention. Thus, an external reference voltage of a fixed level is provided to the output terminal.

Figure 15C:
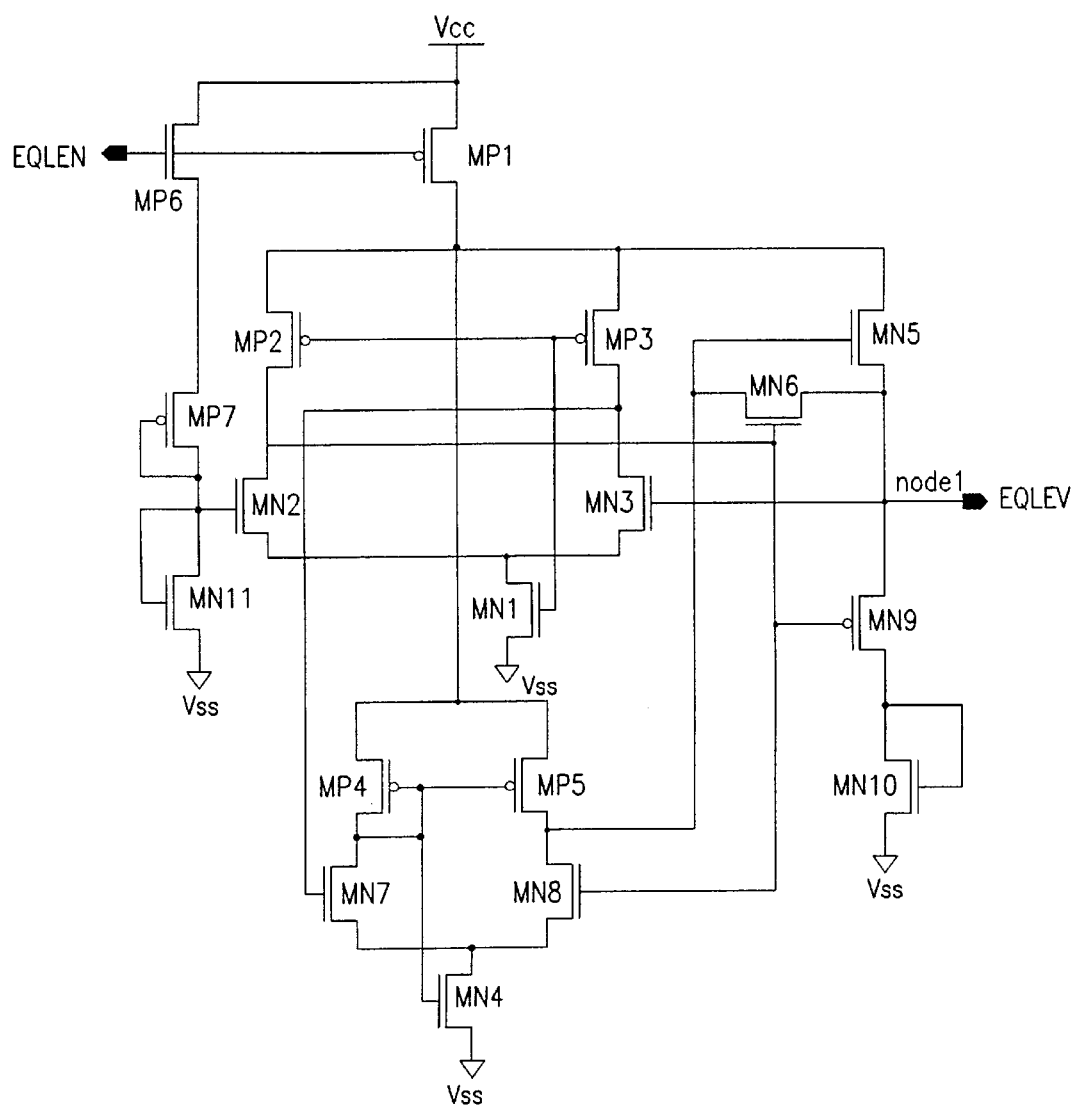
FIG. 15c is a diagram that illustrates a third preferred embodiment of a bitline pre-charge level supplier in accordance with the present invention.

FIG. 15c is a diagram that illustrates a third preferred embodiment of a bitline precharge level supplier in accordance with the present invention. Referring to FIG. 15c, the third preferred embodiment is similar to the second embodiment of the bitline precharge level supplier, except that additional circuitry is added for further stabilization of the level of the output terminal. As shown in FIG. 15c, relative to the second preferred embodiment of FIG. 15b a sixth PMOS transistor MP6 coupled between the power source Vcc and the first PMOS transistor MP1 is adapted to be controlled by an enable signal EQLEN for enabling the third preferred embodiment of the bitline precharge level supplier. In addition, a seventh PMOS transistor MP7 and an eleventh NMOS transistor MN11 are coupled in series between the sixth PMOS transistor MP6 and a ground terminal Vss. The seventh PMOS transistor MP7 has a gate and a drain coupled together, and the eleventh NMOS transistor MN1 1 has a gate and drain coupled to the gate of the second NMOS transistor MN2 in common. In the third preferred embodiment of the bitline precharge level supplier, since the drain voltage of the first PMOS transistor MP1 is varied with a level of the output terminal, the power source voltage Vcc is applied to a place from which the power source voltage does not affect the output terminal (node 1), which prevents or reduces variation of the drain voltage in advance. Accordingly, a more stable precharge level of the output terminal can be provided.

Figure 16A:
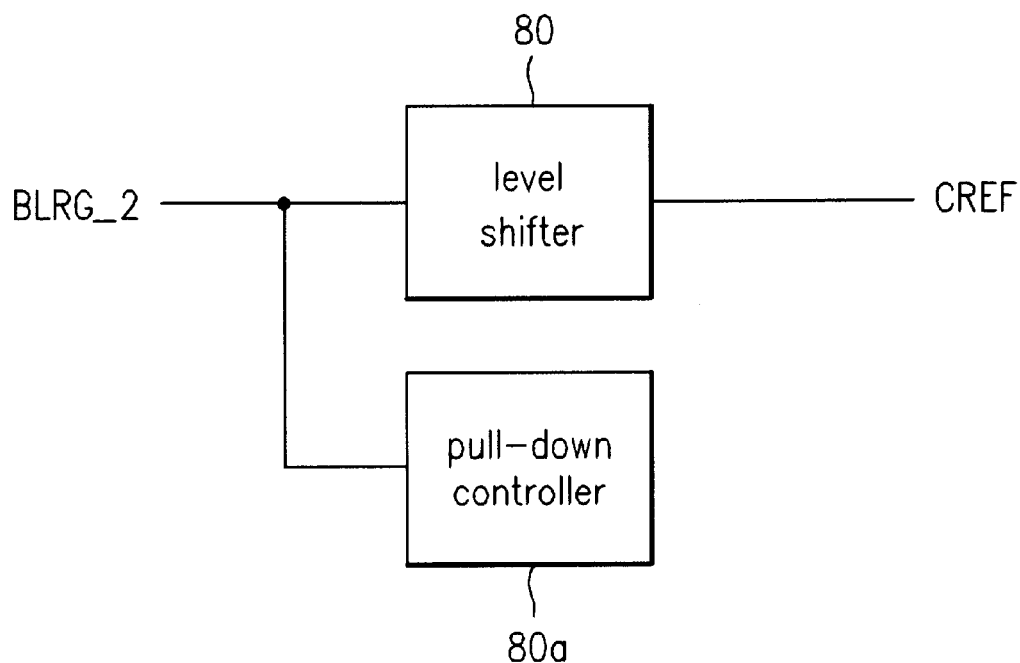
FIG. 16a is a diagram that illustrates a block diagram of a system of an exemplary reference sense amplifier of the present invention, schematically.
Figure 16B:
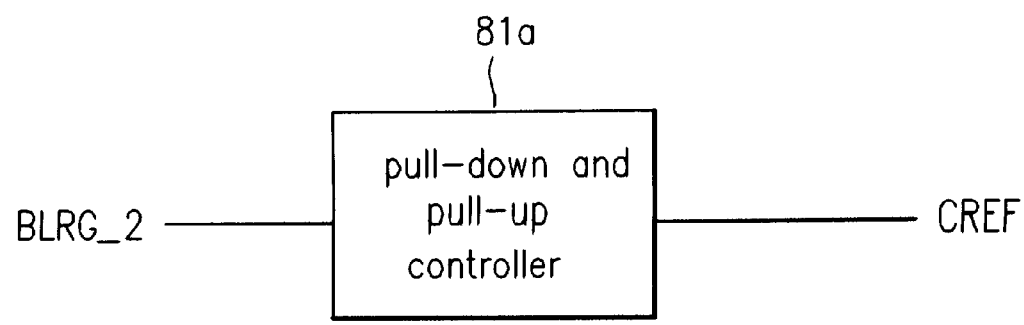
FIG. 16b is a diagram that illustrates another exemplary embodiment block diagram of a system of a reference sense amplifier of the present invention.

FIG. 16a is a diagram that illustrates a block diagram of an exemplary reference sense amplifier of the present invention. Referring to FIG. 16a, a reference sense amplifier in the reference bitline controller includes a level shifter 80 for receiving a signal from a reference global bitline BLRG_2, shifting a level of the signal, and providing a reference voltage CREF to at least one main sense amplifier 67_1, 67_2, . . . , and a pull down controller 80a for receiving a signal from the reference global bitline BLRG_2 for pulling down the reference bitline. Other than a method in which the level shifter 80 is used in shifting a level to provide the reference voltage to the main sense amplifier as shown in FIG. 16a, another exemplary embodiment of a reference sense amplifier using a pull-down and pull-up controller 81 a only instead of the level shifter to use a reference global bitline signal as the reference voltage CREF is shown in FIG. 16b. The level shifter can be dispensed with as shown in FIG. 16b when a capacity below a few hundred bits is required, such as IC card that does not require a large capacity, in which adequate reference voltage can be provided only using a high signal because there are not so many sense amplifiers. However, as shown in FIG. 16a, if there are many sense amplifiers, the level shifter is preferably used in providing the reference voltage from a low signal.

Figure 17A:
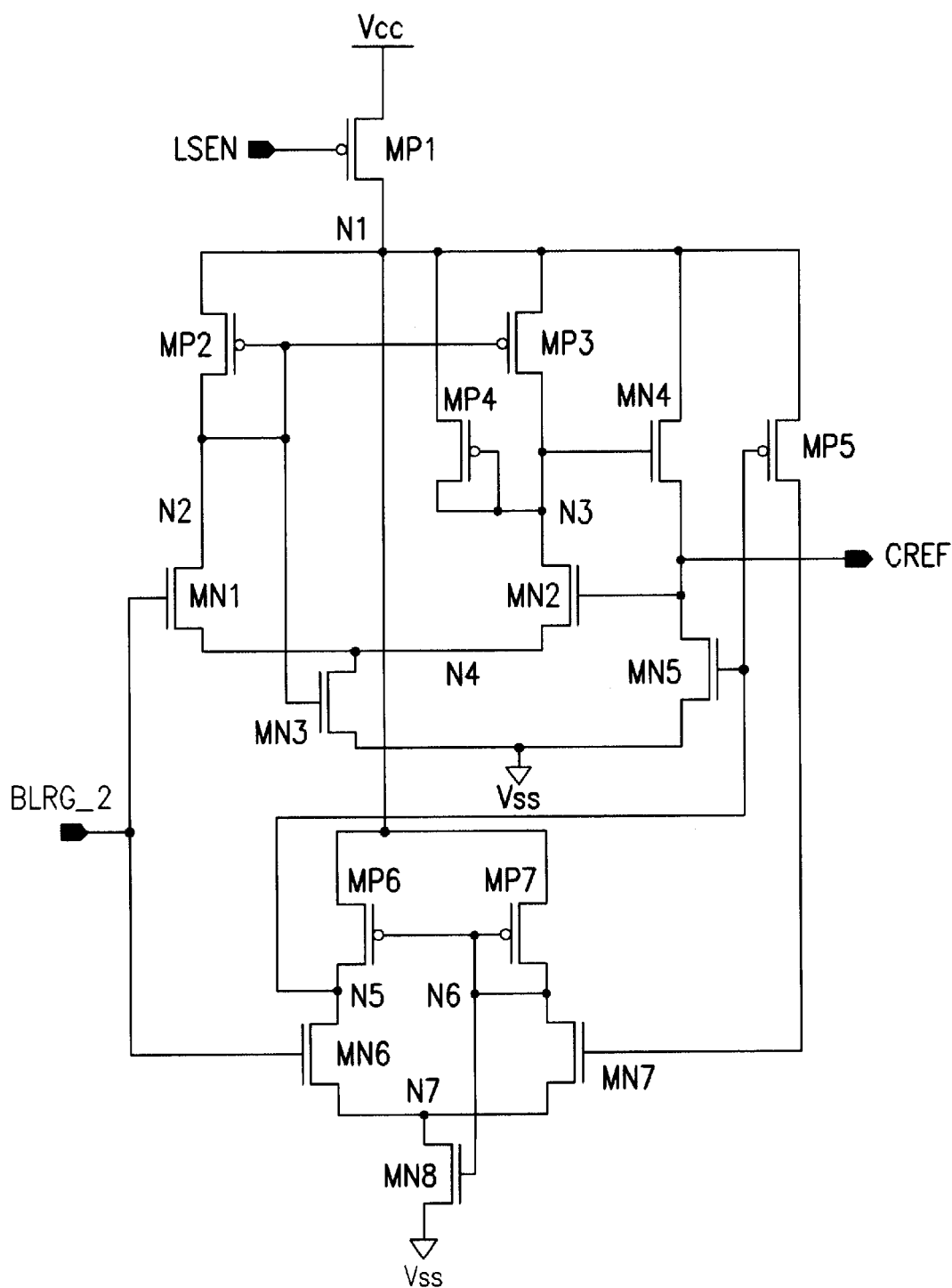
FIG. 17a is a diagram that illustrates a first preferred embodiment of a level shifter in accordance with the present invention.

FIG. 17a is a diagram that illustrates a first preferred embodiment of a level shifter of FIG. 16a in accordance with the present invention. Referring to FIG. 17a, the first preferred embodiment of the level shifter in accordance with the present invention includes a first PMOS transistor MP1 adapted to be controlled by an enable signal LSEN for enabling the level shifter and having a source coupled to a power source Vcc, a second PMOS transistor MP2 and a third PMOS transistor MP3 coupled to a drain of the first PMOS transistor MP1, and a first NMOS transistor MN1 coupled to the second PMOS transistor MP2 and adapted to be controlled by a reference global bitline (e.g., BLRG_2). Gates of the second PMOS transistor MP2 and the third PMOS transistor are coupled together. A second NMOS transistor MN2 is provided between the first NMOS transistor MN1 and the third NMOS transistor MP3, and a fourth PMOS transistor MP4 is disposed between the first PMOS transistor MP1 and the second NMOS transistor MN2 in parallel to the third PMOS transistor MP3. A fourth NMOS transistor MN4 has a source coupled to the first PMOS transistor MP1 and is adapted to be controlled by a signal from the third PMOS transistor MP3. A fifth NMOS transistor MN5 is disposed between a ground terminal Vss and the fourth NMOS transistor MN4, and a fifth PMOS transistor MP5 is disposed between the first PMOS transistor MP1 and an output terminal, which outputs the signal CREF. A sixth NMOS transistor MN6 is adapted to be controlled by the global bitline signal, and a sixth PMOS transistor MP6 is disposed between the sixth NMOS transistor MN6 and the first PMOS transistor MP1. A seventh PMOS transistor MN7 has a gate coupled to a gate of the sixth PMOS transistor MP6 and a source coupled to a drain of the first PMOS transistor MP1, and a seventh NMOS transistor MN7 is disposed between the sixth NMOS transistor MN6 and the seventh PMOS transistor MP7. An eighth NMOS transistor MN8 is coupled between the ground terminal Vss and the seventh NMOS transistor MN7 in parallel to the sixth NMOS transistor MN6.

Operations of the first preferred embodiment of the level shifter in accordance with the present invention will now be described. As shown in FIG. 17a, the signal LSEN provided to the gate of the first PMOS transistor MP1 is a signal for enabling the level shifter. If the enable signal LSEN is transited to low, the level shifter is preferably put into operation to provide the CREF signal at the output terminal. To disable the chip, the LSEN signal is transited to high, to cut off a current. When the LSEN is transited to low, the first PMOS transistor MP1 is enabled, which transits the node N1 to a high level. If the node N3 is low at an initial stage, the fourth PMOS transistor MP4 is turned on, to elevate a level at the node N3. According to the level at node N3, the fourth NMOS transistor MN4 is turned on to elevate a level of the output terminal CREF equal to or lower than a voltage on the reference global bitline BLRG_2. As the first, second and third NMOS transistors MN1, MN2 and MN3 and the second and third PMOS transistors MP2 and MP3 form one amplifier, an output of the node N3 is amplified according to an input to the first NMOS transistor MN1 and the second NMOS transistor MN2. Also, as the sixth, seventh, and eighth NMOS transistor MN6, MN7 and MN8 and the sixth and seventh PMOS transistors MP6 and MP7 form one amplifier, an output of a node N5 is amplified according to an input to the sixth NMOS transistor MN6 and the seventh NMOS transistor MN7. In FIG. 17a, if a size of each of the first and sixth NMOS transistors MN1 and MN6 is greater than a size of each of the second and seventh NMOS transistors MN2 and MN7, the voltage at the output terminal CREF can be made higher than a voltage on the global bitline in proportion to a device size difference. In an opposite case, if a size of each of the first and sixth NMOS transistors MN1 and MN6 is smaller than the second and seventh NMOS transistors MN2 and MN7, a voltage at the output terminal CREF can be made lower than the voltage on the global bitline in proportion to the transistor sizes. Further, if the first and second NMOS transistors MN1 and MN2 have a size identical to the second and seventh NMOS transistors MN2 and MN7, the voltage at the output terminal CREF can be made substantially identical to the voltage on the global bitline.

Operation of the first preferred embodiment of the level shifter when the first and sixth NMOS transistors MN1 and MN6 and the second and seventh NMOS transistors MN2 and MN7 have the same size will now be described. As shown in FIG. 17a, when the voltage on the global bitline is higher than the voltage at the output terminal CREF, a voltage at the node N2 is dropped and a voltage at the node N3 is boosted by the first and second NMOS transistors MN1 and MN2. The boosted node N3 voltage is fed back to the fourth NMOS transistor MN4, to reduce a turning on voltage of the fourth NMOS transistor MN4. With a corresponding increase in current to the output terminal CREF, the voltage at the output terminal is elevated at the end. Then, a voltage at the node N5 is dropped and a voltage at the node N6 is boosted by the sixth and seventh transistors MN6 and MN7. The dropped node N5 voltage is fed back to the fifth NMOS transistor MN5 and the fifth PMOS transistor MP5 to drop a turning on resistance of the fifth NMOS transistor MN5 and increase a current to the output terminal. Thus, the voltage at the output terminal is elevated. The fourth NMOS transistor MN4 and the fifth PMOS transistor MP5 preferably accelerate boosting of the voltages. As shown in FIG. 17a, if the voltage on the global bitline is lower than the voltage at the output terminal CREF, the first NMOS transistor MN1 and the second NMOS transistor MN2 boost the voltage at the node N2 and drop the voltage at the node N3. The dropped node N3 voltage is fed back to the fourth NMOS transistor MN4, which increases a turning on resistance of the fourth NMOS transistor MN4, to reduce a current to the output terminal CREF and drop the voltage at the output terminal CREF. Then, the sixth NMOS transistor MN6 and the seventh NMOS transistor MN7 boost a voltage at the node 5 and drop a voltage at the node 6. The boosted node N5 voltage is fed back to the fifth NMOS transistor MN5 and the fifth PMOS transistor MP5, which reduces a turning on resistance of the fifth NMOS transistor and increases a resistance a turning on resistance of the fifth PMOS transistor MP5. Accordingly, at the end, a current to the output terminal CREF is reduced and a voltage of the output terminal is dropped, which accelerates a voltage drop of the fifth NMOS transistor MN5.

Figure 17B:
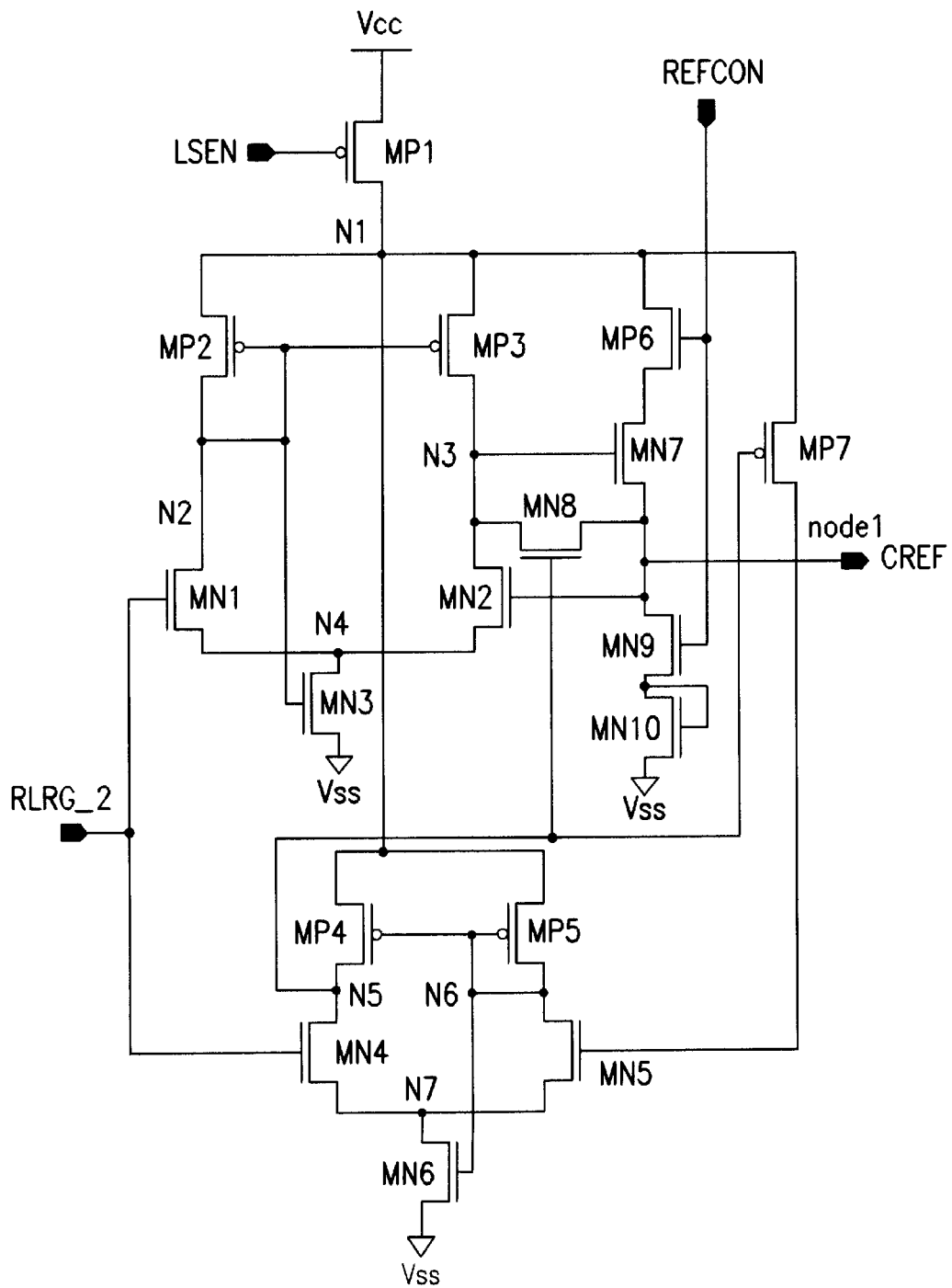
FIG. 17b is a diagram that illustrates a second preferred embodiment of a level shifter in accordance with the present invention.

FIG. 17b is a diagram that illustrates a second preferred embodiment of a level shifter in accordance with the present invention. Referring to FIG. 17b, the level shifter in accordance with the second preferred embodiment of the present invention includes a first PMOS transistor MP1 adapted to be controlled by an enable signal LSEN for enabling the level shifter and having a source coupled to a power source Vcc, a second PMOS transistor MP2 and a third PMOS transistor MP3 having gates coupled together are coupled to a drain of the first PMOS transistor MP1, and a first NMOS transistor MN1 coupled to the second PMOS transistor MP2 and controlled by a bitline signal on a global bitline (e.g., signal RLRG_2 on the reference global bitline). A second NMOS transistor MN2 is coupled between the first NMOS transistor MN1 and the third NMOS transistor MP3 and has a source coupled to a drain of the first NMOS transistor MN1. A third NMOS transistor MN3 is coupled between sources of the first and second NMOS transistors and a ground terminal Vss and is adapted to be controlled by a drain voltage of the second PMOS transistor MP2. A fourth PMOS transistor MP4 and a fifth PMOS transistor MP5 each have a source coupled to a drain of the first PMOS transistor MP1 and a gate coupled together. A fourth NMOS transistor MN4 is adapted to be controlled by the reference global bitline RLRG_2 signal and has a drain coupled to a drain of the fourth PMOS transistor MP4. A fifth NMOS transistor MN5 is controlled by a voltage at a output terminal (node 1) CREF and has a drain coupled to a drain of the fifth PMOS transistor MP5 and a source coupled to a source of the fourth NMOS transistor MN4, and a sixth NMOS transistor MN6 is controlled by a drain voltage of the fifth NMOS transistor MN5 and coupled between the sources of the fourth and fifth NMOS transistors MN4 and MN5 and a ground terminal Vss. A sixth PMOS transistor MP6 adapted to be controlled by an external reference voltage control signal REFCON and has a source coupled to a drain of the first PMOS transistor MP1. A seventh NMOS transistor MN7 is adapted to be controlled by a drain voltage of the third PMOS transistor MP3 and has a source coupled to a drain of the sixth PMOS transistor MP6, and an eighth NMOS transistor MN8 is controlled by a drain voltage of the fourth NMOS transistor MN4 and coupled between a drain of the third PMOS transistor MP3 and a drain of the seventh NMOS transistor MN7. A ninth NMOS transistor MN9 and a tenth NMOS transistor MN10 are adapted to be controlled by the reference voltage control signal REFCON and are coupled between the seventh NMOS transistor MN7 and the ground terminal Vss in series. Further, a seventh NMOS transistor MP7 is controlled by a drain voltage of the fourth NMOS transistor MN4 and has a source coupled to a drain of the first PMOS transistor MP1 and a drain coupled to the output terminal (node 1) CREF.

Figure 18:
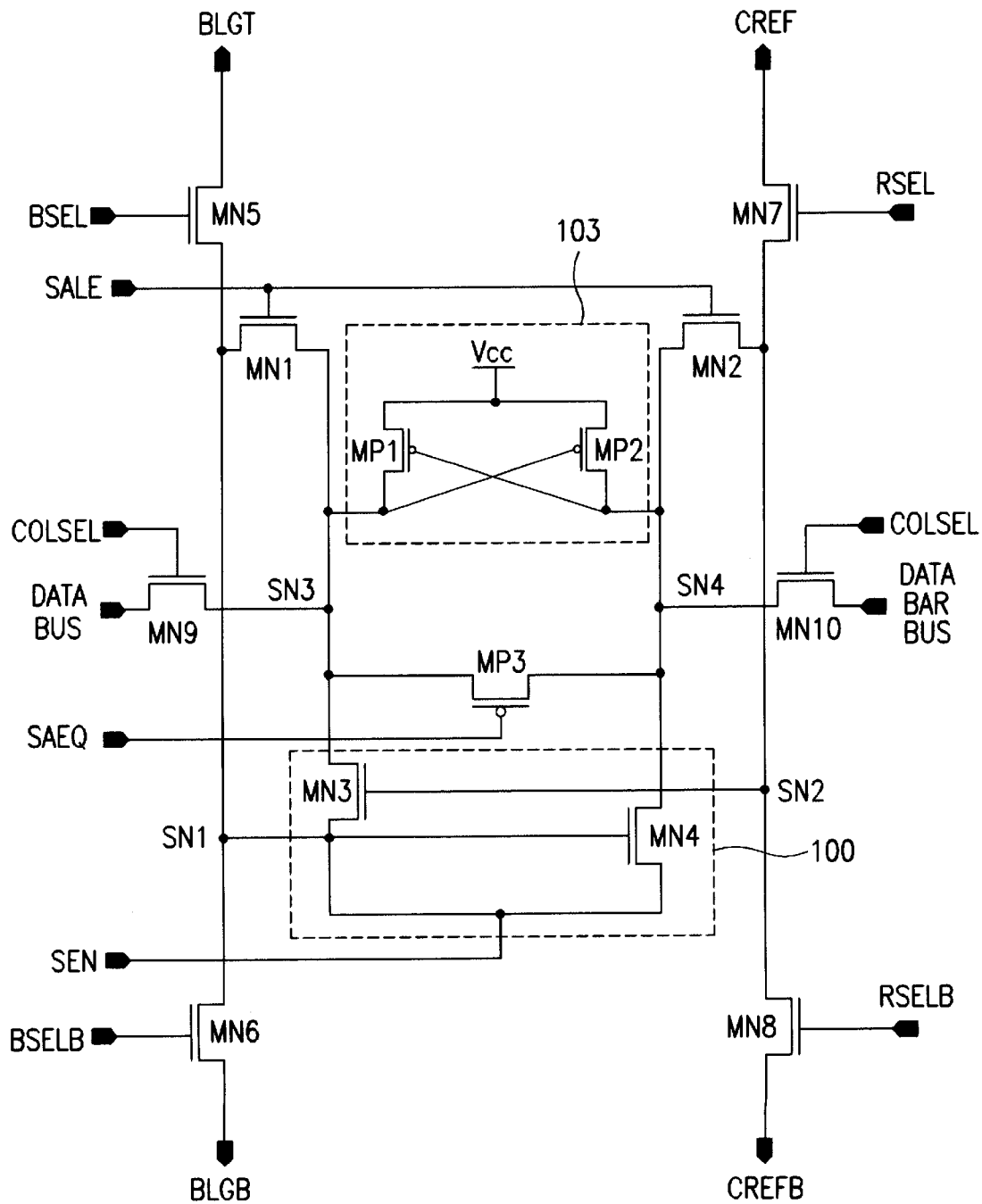
FIG. 18 is a diagram that illustrates a first preferred embodiment of a sense amplifier for a first embodiment non-volatile ferroelectric memory of the present invention.

FIG. 18 is a diagram that illustrates a first preferred embodiment of sense amplifier for use in the first preferred embodiment non-volatile ferroelectric memory of the present invention. As shown in FIG. 7, the main bitline controller 67 is disposed between two main cell arrays 61. The sense amplifier in the main bitline controller 67 is preferably adapted to sense data of both main cell arrays 61 above and below the sense amplifier. That is, a system of the upper main cell array and the lower cell array is preferably made to share one bitline controller. In FIG. 18, a BLGT denotes a main global bitline coupled to an upper cell array, and a BLGB denotes a main global bitline coupled to a lower cell array. CREF denotes a reference global bitline coupled to an upper reference cell, and CREFB denotes a reference global bitline coupled to a lower reference cell. In FIG. 18a, the first preferred embodiment sense amplifier for a first embodiment of the non-volatile ferroelectric memory of the present invention includes a first NMOS transistor MN1 having a source coupled to the BLGT and BLGB, a second NMOS transistor MN2 having a source coupled to the CREF and the CREFB and a gate coupled to a gate of the first NMOS transistor MN1. A third NMOS transistor MN3 amplifies the BLGT or BLGB signal received through the first NMOS transistor MN1, and a fourth NMOS transistor MN4 amplifies the CREF or CREFB signal received through the second NMOS transistor MN2. A first PMOS transistor MP1 and a second PMOS transistor MP2 each have a source coupled to a power terminal Vcc and a drain respectively coupled to an output terminal of the first NMOS transistor MN1 and an output terminal of the second NMOS transistor MN2. A drain of the first PMOS transistor MP1 is coupled to a gate of the second PMOS transistor MP2 and a drain of the second PMOS transistor MP2 is coupled to a gate of the first PMOS transistor MP1. A third PMOS transistor MP3 equalizes an output terminal of the first NMOS transistor MN1 and an output of the second NMOS transistor MN2 in response to a sense amplifier equalizing signal SAEQ. A fifth NMOS transistor MN5 is disposed between a source of the first NMOS transistor MN1 and the BLGT, and a sixth NMOS transistor MN6 is disposed between a source of the first NMOS transistor MN1 and the BLGB. A seventh NMOS transistor MN7 is disposed between a source of the second NMOS transistor MN2 and the CREF, and an eighth NMOS transistor MN8 is disposed between a source of the second NMOS transistor MN2 and the CREFB. The fifth NMOS transistor MN5 switches between the sense amplifier and the BLGT, and the sixth NMOS transistor MN6 switches between the sense amplifier and the BLGB. The seventh NMOS transistor MN7 switches between the sense amplifier and the CREF, and the eighth NMOS transistor MN8 switches between the sense amplifier and the CREFB. Further, there are a ninth NMOS transistor MN9 for selectively switching output terminals of a data bus and the sense amplifier in response to a column selection signal COLSEL, and a tenth NMOS transistor MN10 for switching output terminals of a data bar bus and the sense amplifier in response to the column selection signal COLSEL.

Operations of the first preferred embodiment of the sense amplifier according to the present invention will now be described. An operation of the first embodiment sense amplifier described below as an example is based on a case when a data stored in the upper main cell array is sensed. Referring to FIG. 18, when the fifth and seventh NMOS transistors MN5 and MN7 are enabled by an enable signal BSEL for enabling the first NMOS transistor MN5 and an enable signal RSEL for enabling the seventh NMOS transistor MN7, the sixth and eighth NMOS transistors MN6 and MN8 are disabled. In contrast, if the sixth and eighth NMOS transistor MN6 and MN8 are enabled, the fifth and seventh NMOS transistors MN5 and MN7 are disabled. The sense amplifier is disabled in response to the column selection signal COLSEL during an initial amplification period, which respectively cuts off a coupling between an external data bus DATA BUS, DATA BUS BAR and respective nodes SN3, SN4 inside of the sense amplifier. In this instance, to enable the sense amplifier, the node SN3 and the node SN4 are equalized in response to a sense amplifier equalizing signal SAEQ. In the initial stage, the first NMOS transistor MN1 and the second NMOS transistor MN2 are kept disabled. Then, once the node SN3 and the node SN4 are equalized, the data in the main cell is transferred to the upper global bitline BLGT, and therefrom to the node SN1 through the fifth NMOS transistor MN5. The reference voltage is transferred to the CREF, and therefrom to the node SN2 through the seventh NMOS transistor MN7. Provided that the data in the main cell and the reference voltage are respectively and adequately transferred to the nodes SN1 and SN2, the reference voltage of the sense amplifier is transited to a ground voltage. The main cell data and the reference voltage transfer causes a voltage difference between the node SN2 coupled to the gate of the third NMOS transistor MN3 and the node SN1 coupled to the gate of the fourth NMOS transistor MN4, together with a difference of currents to the third NMOS transistor MN3 and the fourth NMOS transistor MN4. The voltages are amplified to show an amplified voltage being a difference of voltages at the node SN3 and the node SN4. The voltages induced at the node SN3 and the node SN4 are amplified again by the first PMOS transistor MP1 and the second PMOS transistor MP2, respectively. After being adequately amplified at the first PMOS transistor MP1 and the second PMOS transistor MP2, the voltages disable the fifth and seventh NMOS transistors MN5 and MN7, respectively, and the voltages enable the first and second NMOS transistors MN1 and MN2, to feed the amplified voltages at the nodes SN3 and SN4 back again to the nodes SN1 and SN2 while maintaining the amplification. Upon completion of a feedback loop, the ninth and tenth NMOS transistors MN9 and MN10 are enabled, to permit data exchange between the external buses DATA BUS, DATA BAR BUS and the sense amplifier. The fifth NMOS transistor MN5 is then enabled again, to transmit a voltage at the node SN1 to the BLGT for feeding back and restoring in the main cell. According to such a sense amplifier operation, the third NMOS transistor MN3 and the fourth NMOS transistor MN4 form a first amplifier 100, and the first PMOS transistor MP1 and the second PMOS transistor MP2 form a second amplifier 103. SEN denotes a sense amplifier enable signal that is a low active signal, and the signal SALE denotes a signal for enabling the first NMOS transistor MN1 and the second NMOS transistor MN2, which is a high active signal.

Figure 19:
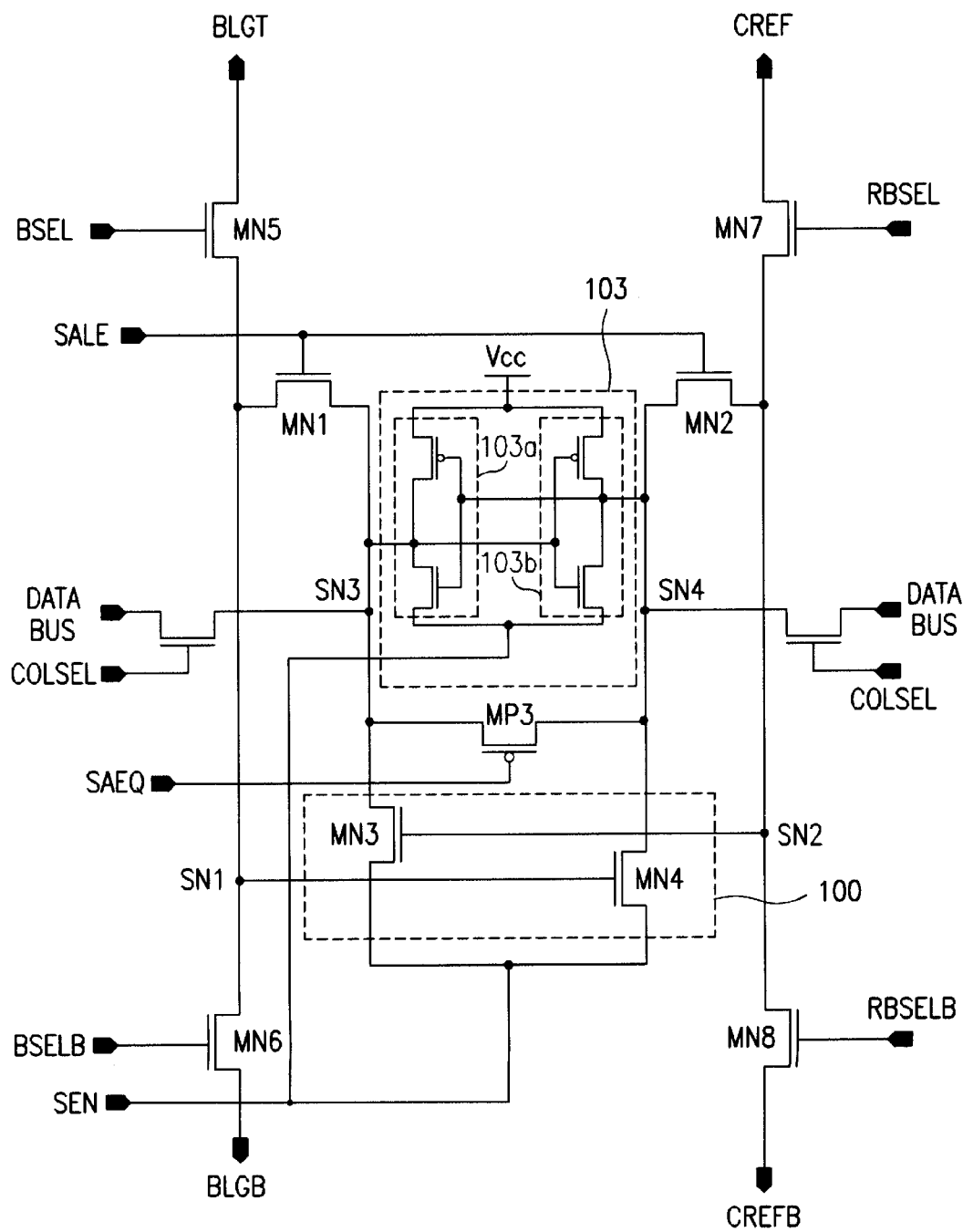
FIG. 19 is a diagram that illustrates a second preferred embodiment of a sense amplifier for a first embodiment non-volatile ferroelectric memory of the present invention.

FIG. 19 is a diagram that illustrates a second preferred embodiment of a sense amplifier for the first preferred embodiment of the non-volatile ferroelectric memory according to the present invention. As shown in FIG. 19, the second preferred embodiment of the sense amplifier differs from the first preferred embodiment of the sense amplifier in a second amplifier 103'. The second amplifier 103 in the first preferred embodiment of the sense amplifier has the first and second transistors, which are PMOS, as shown in FIG. 18. However, the second preferred embodiment of the sense amplifier includes the second amplifier 103' that has a latch circuit, inclusive of a first inverter 103a and a second inverter 103b of PMOS and NMOS transistors. A common gate of the PMOS and NMOS transistors of the first inverter 103a is coupled to a drain of the PMOS transistor of the second inverter 103b. A common gate of the PMOS and NMOS transistors of the second inverter 103b is coupled to a drain of the PMOS transistor of the first inverter 103a. The NMOS transistor of the first inverter 103a and the NMOS transistor of the second inverter 103b are both coupled together to a ground terminal Vss. Since a system of the second preferred embodiment of the sense amplifier according to the present invention is similar to the first preferred embodiment of the sense amplifier except the second amplifier 103' has two invertors and the NMOS transistors in the first and second invertors 103a and 103b are coupled to the sense amplifier enable signal SEN input terminal. Accordingly, a detailed description of the second preferred embodiment of the sense amplifier according to the present invention will be omitted.

Figure 20:
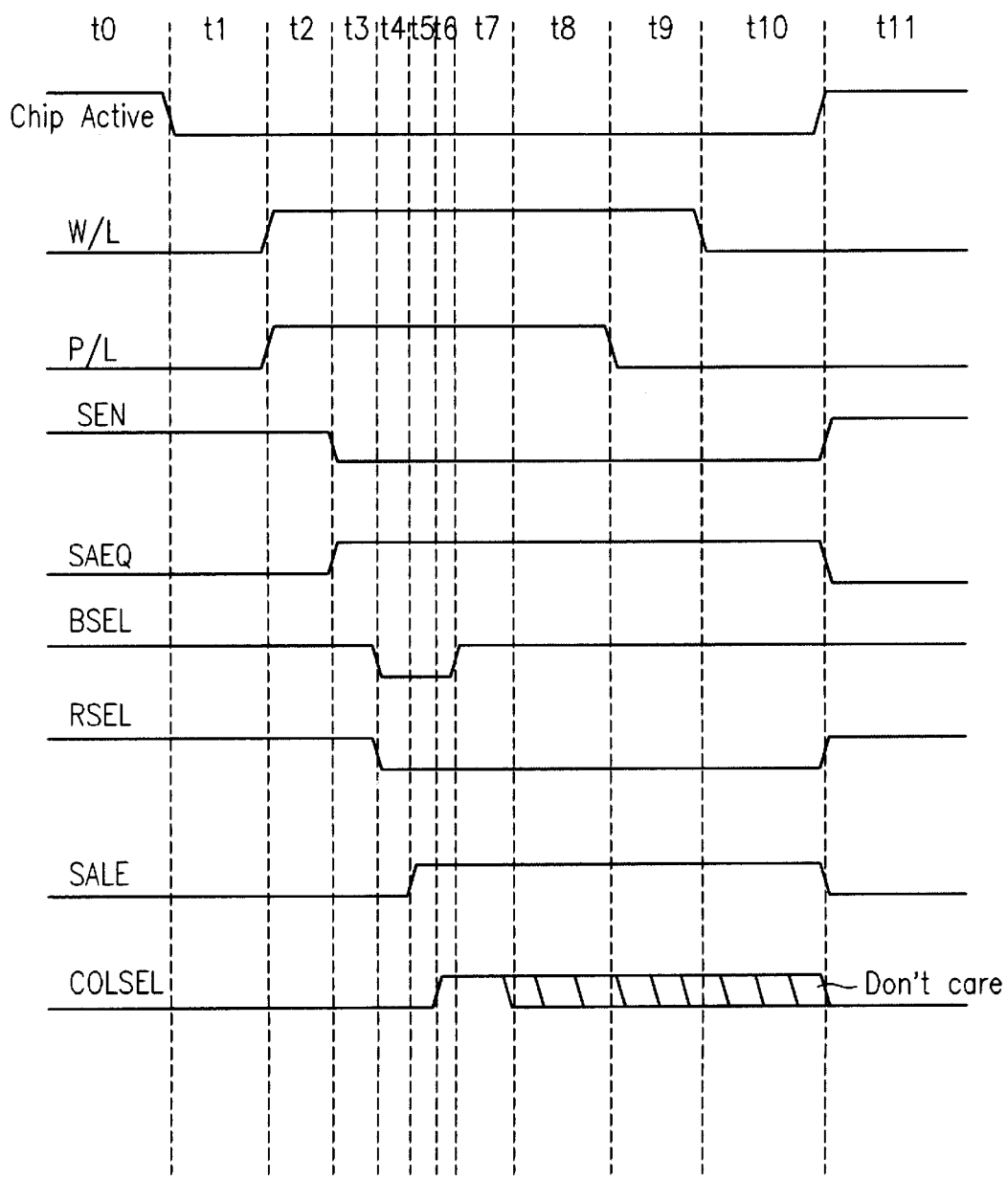
FIG. 20 is a diagram that illustrates an operation timing diagram of the sense amplifier in FIG. 18.
Figure 21:
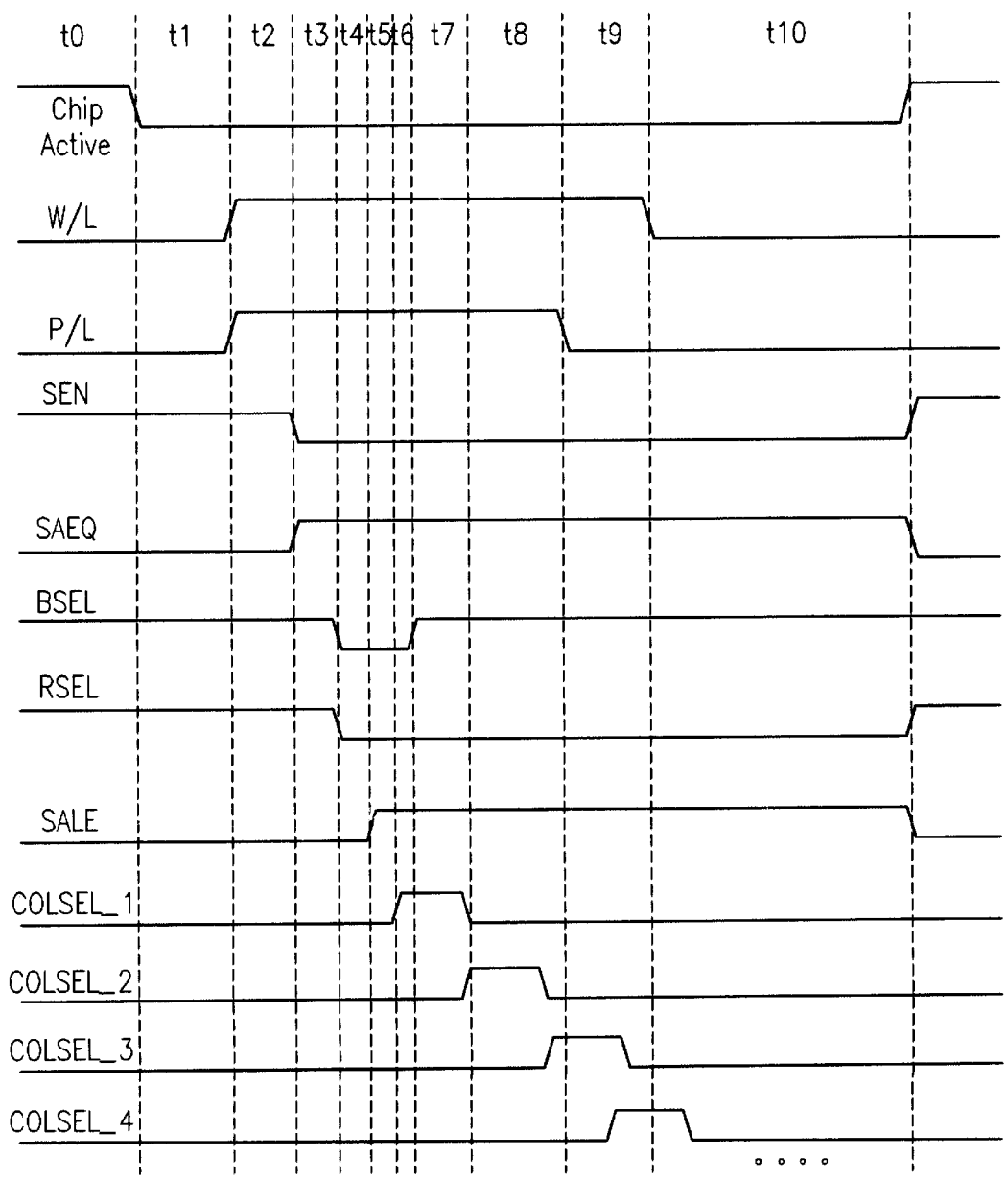
FIG. 21 is a diagram that illustrates an operation timing diagram in a read mode of the sense amplifier in FIG. 18.
Figure 22:
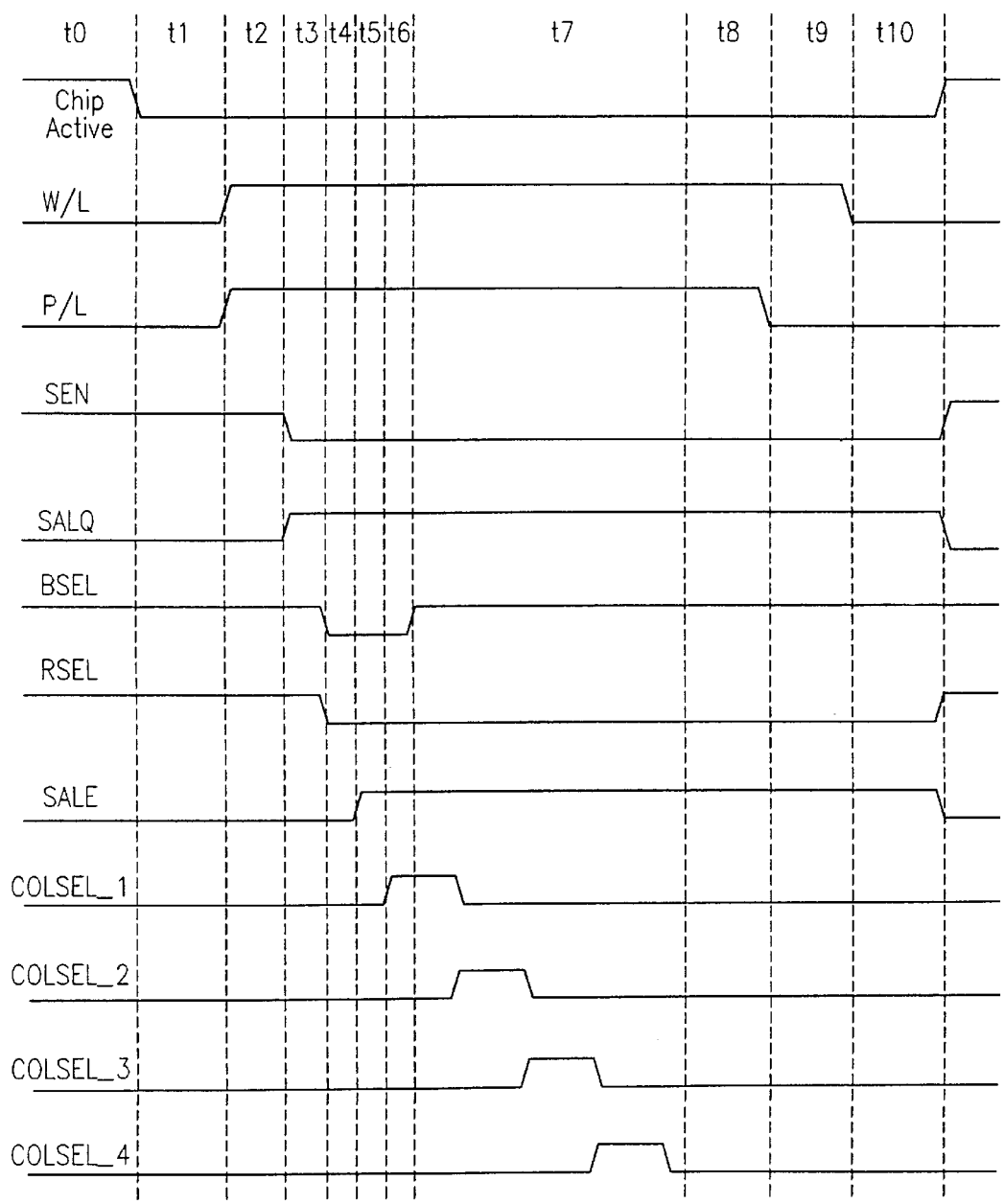
FIG. 22 is a diagram that illustrates an operation timing diagram in a write mode of the sense amplifier in FIG. 18.

FIG. 20 is a diagram that illustrates timing diagrams of the first preferred embodiment of the sense amplifier shown in FIG. 18. FIG. 21 is a diagram that illustrates timing diagrams in a read mode of the sense amplifier in FIG. 18. FIG. 22 is a diagram that illustrates timing diagrams in a write mode of the sense amplifier shown in FIG. 18.

Referring to FIG. 20, if the wordline W/L and the plate line P/L are transited high at the same time, the sense amplifier enable signal SEN is enabled to low. As shown in FIG. 18, if the signal SALE which enables both the first and second NMOS transistors MN1 and MN2, is enabled high, a column selection signal COLSEL is transited to high. As shown in FIG. 21, in a read mode of the sense amplifier, when the signal SALE is transited high in an period when both the wordline W/L and the plateline P/L are high, the column selection signal is transited to a high level in succession COLSEL_1, . . . , COLSEL_4. A transition operation of the column selection signal is made in succession until a t10 period. Different from the read mode, in a write mode as shown in FIG. 22, a transition operation of the column selection signal is made in succession only within t6~t7 periods of periods in which both the wordline W/L and the plateline P/L are in high. That is, when the signal SALE is enabled high as shown in FIG. 18, the column selection signal COLSEL_1, COLSEL_2, . . . , COLSEL_n, is transited in succession within t6~t7 periods among periods in which both the wordline and the plateline are in high. After all the column selection signals are transited to high in succession, the wordline W/L is transited to low, and when the wordline W/L is transited from low to high again, the plateline P/L is transited to low.

Figure 23A:
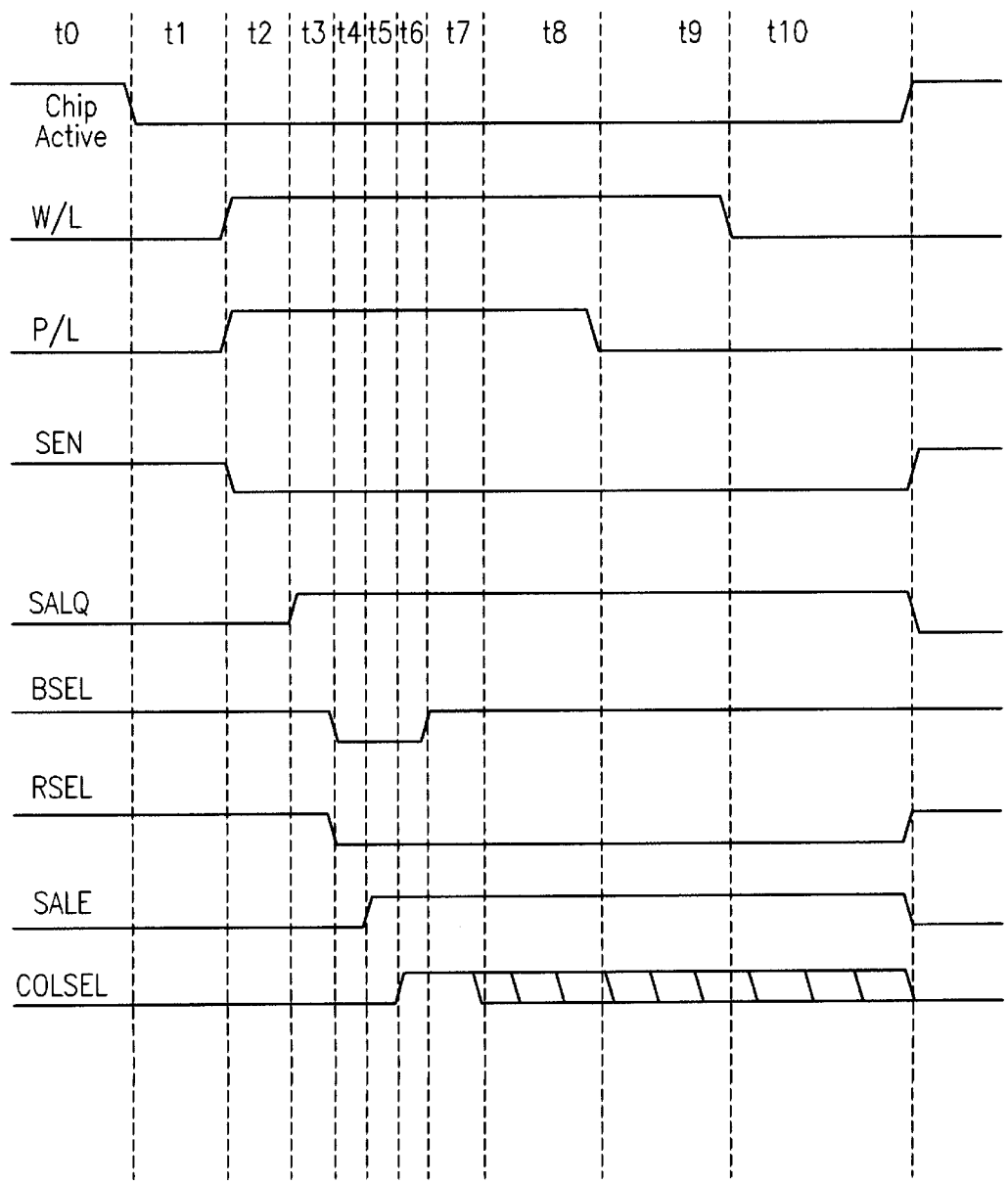
FIG. 23a is a diagram that illustrates an operation timing diagram of the sense amplifier in FIG. 19.

FIG. 23a is a diagram that illustrates timing waveforms of the second preferred embodiment of the sense amplifier shown in FIG. 19. Referring to FIG. 23a, the sense amplifier enable signal SEN is enabled to low with the transition to high of both of the wordline W/L and the plateline P/L. That is, by enabling the sense amplifier enable signal SEN earlier than the previously described SALE signal, a sensing speed can be improved or increased.

Figure 23B:
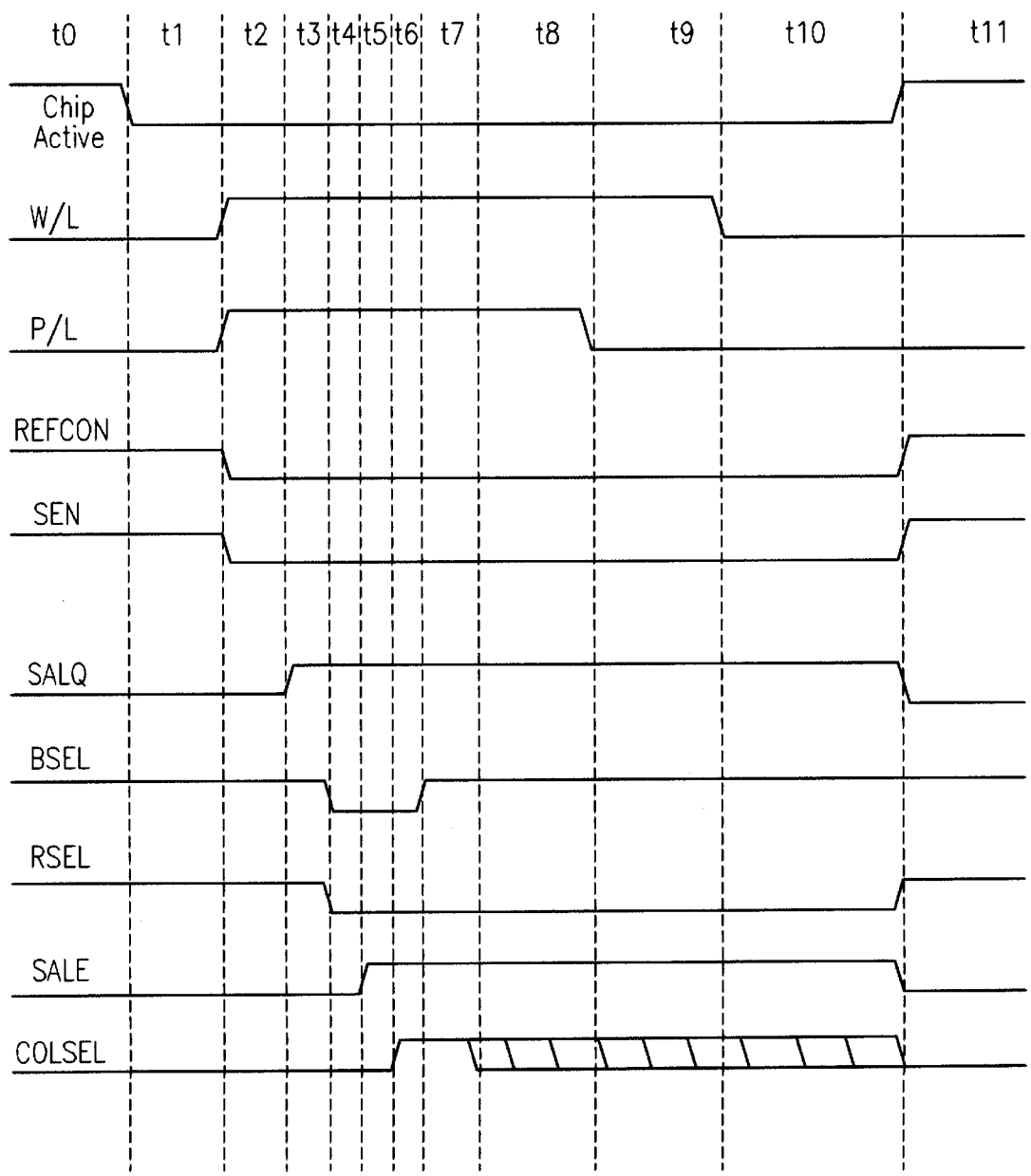
FIG. 23b is a diagram that compares signals used in the sense amplifier in FIG. 19 with a REFCON signal used in a level shifter in FIG. 17b.

FIG. 23b is a diagram that illustrates timing waveforms comparing signals used in the second preferred embodiment of the sense amplifier in FIG. 19 with a REFCON signal used in the second preferred embodiment of the level shifter in FIG. 17b. Referring to FIG. 23b, the sense amplifier enable signal SEN is enabled to low at the same time with the transition of the control signal REFCON, which is used in stabilizing an output terminal level of the level shifter. That is, by compensating for a level variation at the output terminal of the level shifter in advance using the REFCON signal before the SALE signal is enabled to high, the sense amplifier that receives a reference voltage CREF from the level shifter can make a stable operation.

Figure 24:
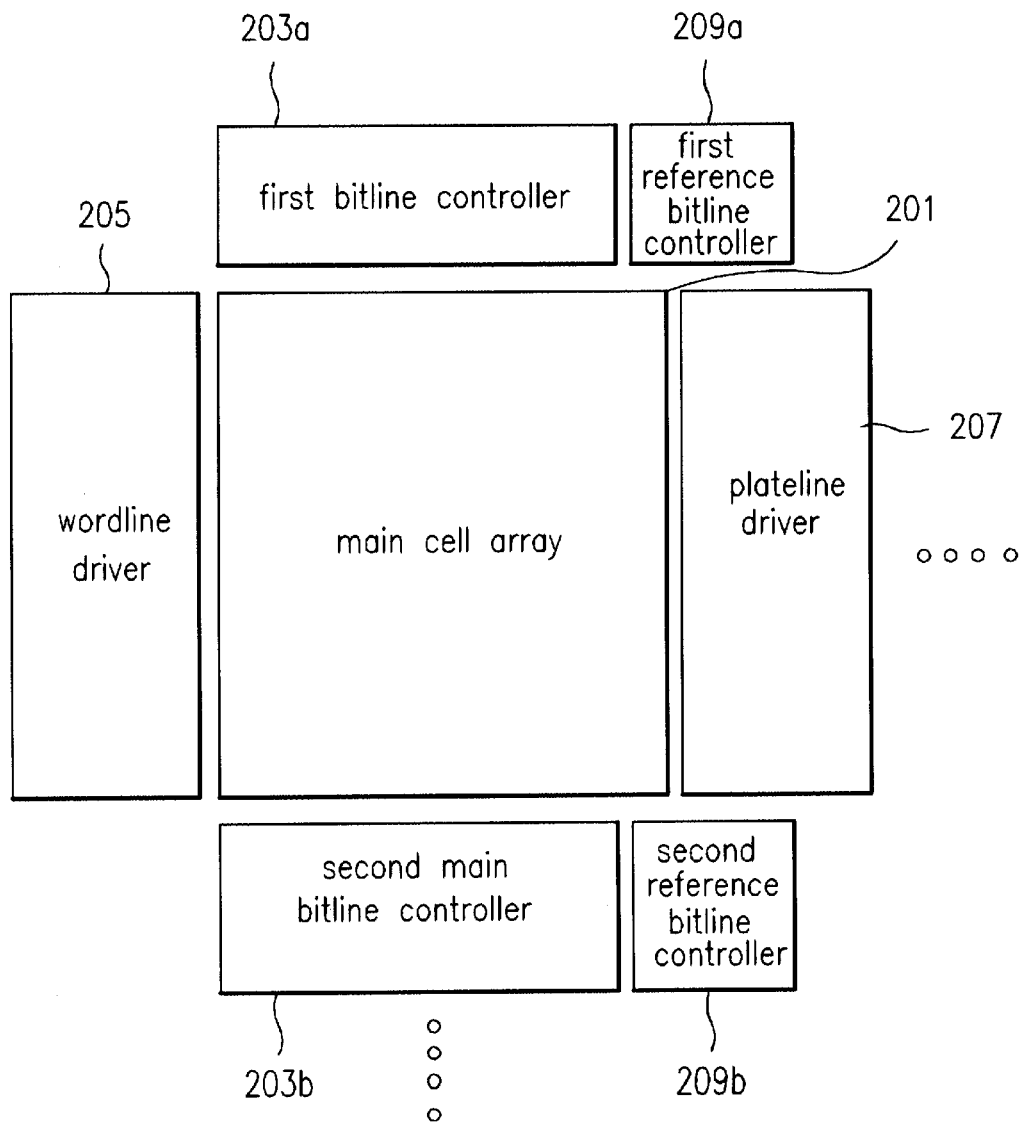
FIG. 24 is a diagram that illustrates a system of cell array of a non-volatile ferroelectric memory in accordance with a second preferred embodiment of the present invention.

FIG. 24 is a diagram that illustrates a system of a second preferred embodiment of a cell array of a non-volatile ferroelectric memory in accordance with the present invention. Upon comparison of the cell array shown in FIG. 24 to the cell array shown in FIG. 6, the cell array shown in FIG. 24 provides the main bitline controller and the reference bitline controller above and below the main cell array for a better or reduced layout.

Referring to FIG. 24, the second preferred embodiment of the cell array includes a main cell array 201, a first main bitline controller 203a and a second main bitline controller 203b respectively formed above and below the main cell array 201, a wordline driver 205 formed on one side of the main cell array 201, a plateline driver 207 formed on the other side of the main cell array 201, and a first reference bitline controller 209a and a second reference bitline controller 209b respectively formed adjacent the first and second main bitline controllers 203a and 203b.

Figure 25:
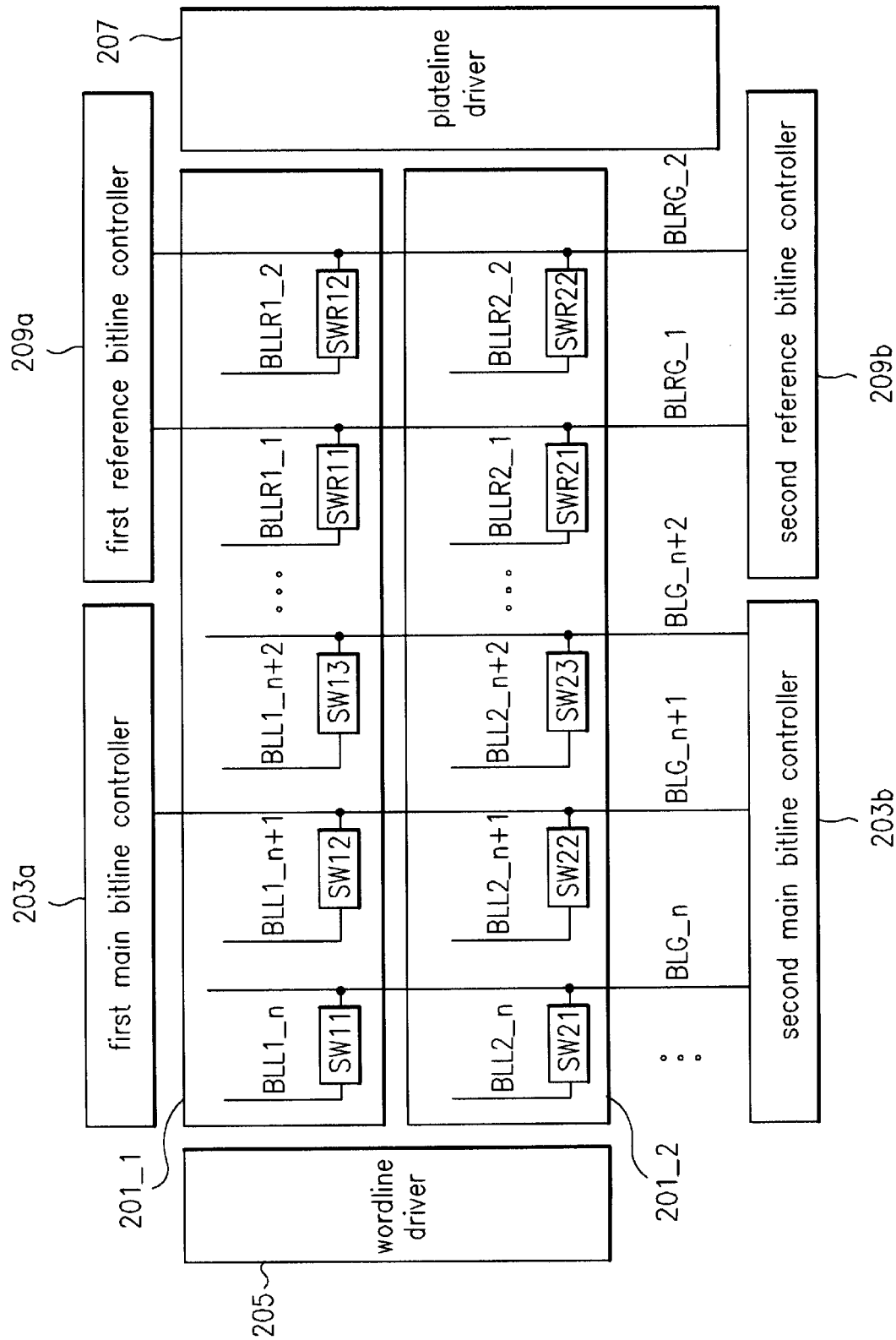
FIG. 25 is a diagram that illustrates a system in FIG. 24 centered on a main cell array.

FIG. 25 is a diagram that illustrates additional detail of the system of FIG. 24 centered on a main cell array. Referring to FIG. 25, of the main global bitlines in the main cell array 201, the odd numbered main global bitlines BLG_n, BLG_n+2, BLG_n+4, . . . are coupled to the second main bitline controller 203b below the main global bitline, and the even numbered main global bitlines BLG_n+1, BLG_n+3, BLG_n+5 . . . are coupled to the first main bitline controller 203a above the main global bitline. The reference global bitlines BLRG_1 and the BLRG_2 are preferably coupled to the reference bitline controllers 209a and 209b above and below the main cell array, with each of the reference bitline controllers 209a and 209b taking two reference global bitlines BLRG_1 and the BLRG_2. The main cell array 201 further includes a plurality of sub cell arrays 201_1, 201_2, . . . . Each of the sub cell array has a main local bitlines corresponding to the main global bitline. For example, in correspondence to the first main global bitline BRG_n, a plurality of main local bitlines BLL1_n, BLL1_n, . . . , BLLn_n are provided. And, the reference global bitlines BLRG_1, BLRG_2 are also provided with reference local bitlines. For example, there are a plurality of reference local bitlines BLLR1_1, BLLR2_1, . . . , BLLRn_1 provided in correspondence with the first reference global bitline BLRG_1. The main local bitlines each formed for one of the sub cell arrays are selectively coupled to corresponding main global bitlines using switches SW1~SWnn, respectively. As the switches are turned on/off selectively, relevant main local bitlines are coupled to the main global bitline. In this instance, if one of switches (e.g., SW11, SW12, SW13, . . . , SW1n) is turned on in one sub cell array (e.g., the first sub cell array 201_1) is coupled to an odd numbered main global bitline BLG_n, or BLG_n+2, or BLG_n+4, . . . , a data of the relevant main local bitline is transferred to the main sense amplifier (not shown) in the second main bitline controller 203b. If a selected cell is coupled to an even numbered main global bitline BLG_n+1, or BLG_n+3, or BLG_n+5, . . . , the data is transferred to the reference sense amplifier(not shown) in the first main bitline controller 203a.

Figure 26:
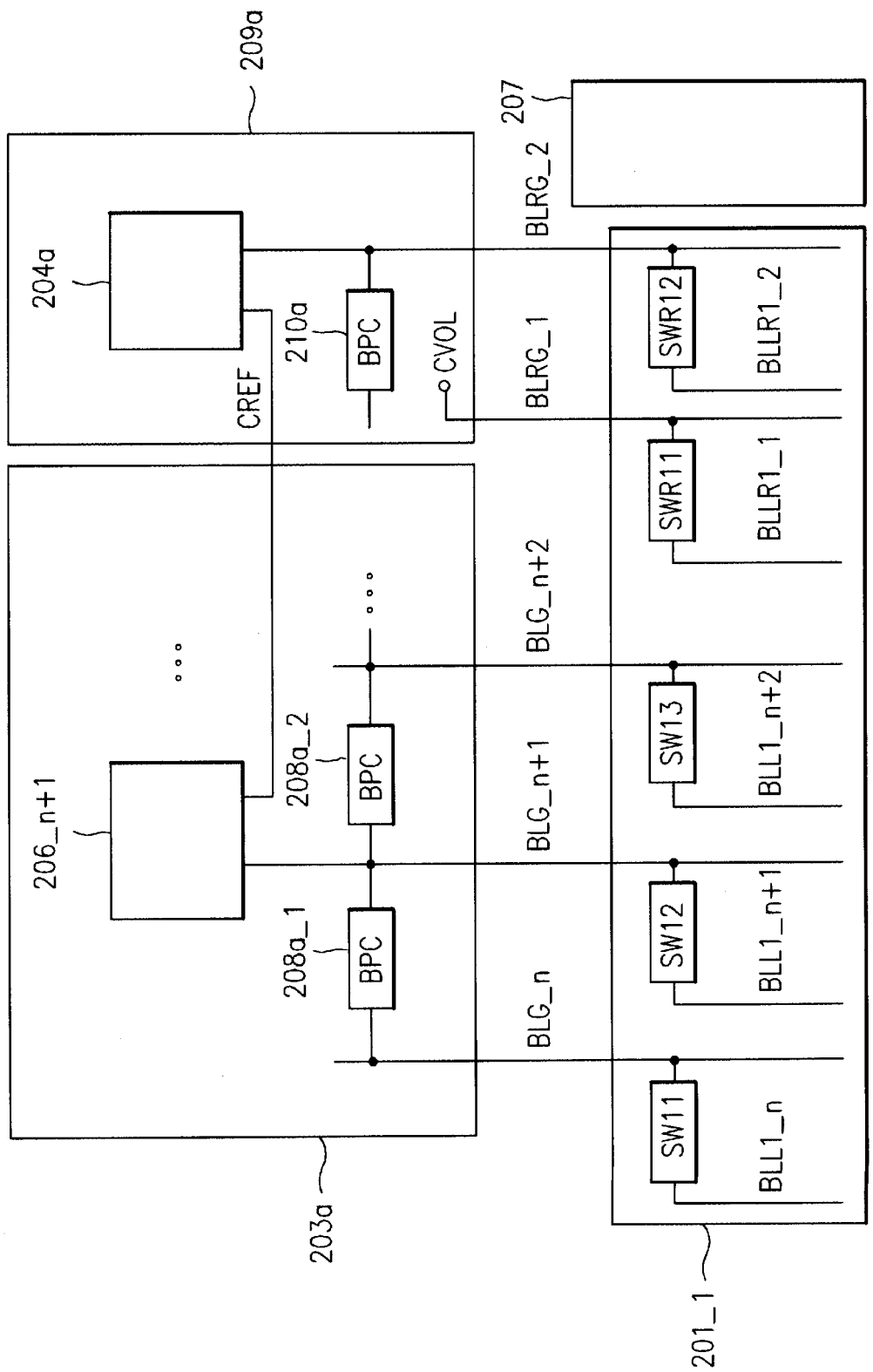
FIG. 26 is a diagram that illustrates additional detail of the block diagram in FIG. 24 centered on a first main bitline controller and a first reference bitline controller.

FIG. 26 is a diagram that illustrates additional detail of the block diagram in FIG. 24 centered on a first main bitline controller and a first reference bitline controller. Referring to FIG. 26, the first reference bitline controller 209a has one reference sense amplifier 204a, and the first main bitline controller 203a has a main sense amplifiers 206_n+1, 206_n+3, 206_n+5, . . . coupled to every even numbered main global bitline BLG_n+1, BLG_n+3, BLG_n+5, . . . . Since odd numbered main global bitlines BLG_n, BLG_n+2, BLG_n+4, . . . are coupled to the second main bitline controller (not shown), the second main bitline controller also has a main sense amplifier (not shown). Similar to the first preferred embodiment of the cell array system according to the present invention shown in FIG. 13, a bitline precharge circuit 208a_1, 208a_2, . . . is provided between adjacent main global bitlines. There is also a bitline precharge circuit 210a between a last main global bitline and a reference global bitline BLRG_2 coupled to the reference sense amplifier 204a. The first reference bitline controller 209a is coupled to two reference global bitlines BLRG_1, BLRG_2, one coupled to the reference sense amplifier 204a and the other applied with a constant voltage CVOL. The main sense amplifiers 206_n+1, 206_n+3, . . . in the first main bitline controller 203a receive the reference voltage CREF from the reference sense amplifier 204a.

Figure 27:
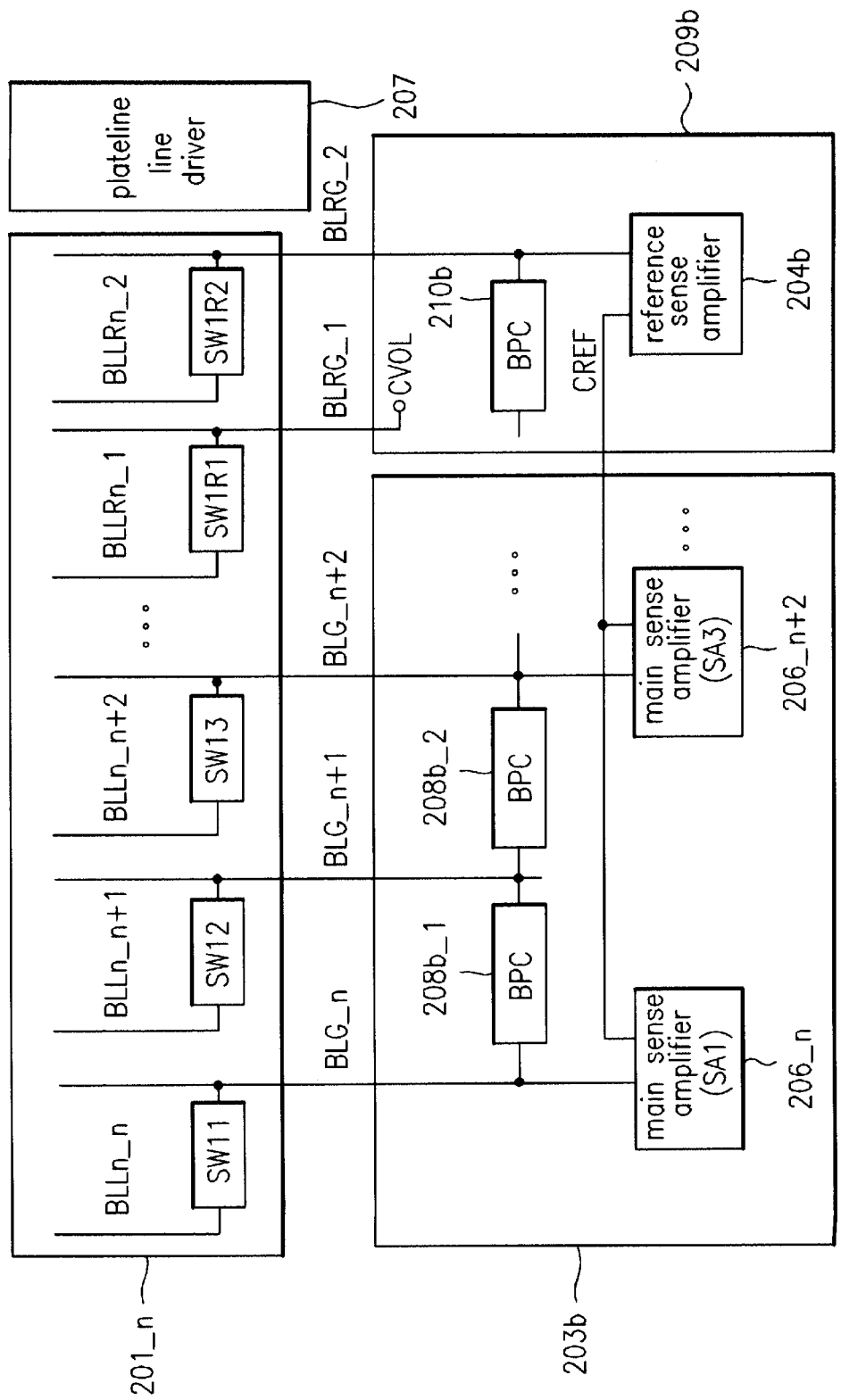
FIG. 27 is a diagram that illustrates additional detail of the block diagram in FIG. 24 centered on a second main bitline controller and a second reference bitline controller.

FIG. 27 is a diagram that illustrates additional detail of the block diagram in FIG. 24 centered on a second main bitline controller and a second reference bitline controller. Referring to FIG. 27, a system of the second main bitline controller 203b and the second reference bitline controller 209b is identical to the first main bitline controller 203a and the first reference bitline controller 209a. That is, the second reference bitline controller 209b has one reference sense amplifier 204b, and the second main bitline controller 203b has main sense amplifiers 206_n, 206_n+2 on every odd numbered main global bitline BLG_n, BLG_n+2, . . . . The reference sense amplifier 204b has one reference global bitline BLRG_2 coupled thereto, and another receives a constant voltage. A bitline precharge circuit 208b_1, 208b_2, . . . is provided between adjacent main global bitlines, and the main sense amplifiers 206_n, 206_n . . . receive the reference voltage CREF from the reference sense amplifier 204b. In addition, the sub cell array of the second preferred embodiment of a cell array system according to the present invention is substantially the same as the first preferred embodiment described with reference to FIG. 10. Accordingly, a detailed description is omitted. Further, systems of the sense amplifier, the level shifter and the bitline precharge level supplier in the second preferred embodiment of the cell array system for a non-volatile ferroelectric memory are substantially the same as the first preferred embodiment.

As described above, preferred embodiments according to the present invention have various advantages. In particular, in the first and second preferred embodiments of a circuit for driving a non-volatile ferroelectric memory because the main cell is accessed once every time the reference cell is accessed once, a number of times of access to the reference cell and the main cell are the same. Therefore, different from the related art in which the reference cell is accessed excessively in comparison to the main cell, a device lifetime can be prolonged because induced voltages by the reference cell and the main cell can be maintained the same. In addition, the stable supply of the sense amplifier reference voltage permits a stable sensing operation.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A non-volatile ferroelectric memory comprising:
  a cell array having a plurality of sub cell arrays, a plurality of global bitlines and at least one pair of reference global bitlines extending in a first direction to cross the sub cell arrays, local bitlines and reference local bitlines respectively corresponding to the global bitlines and the reference global bitlines that also extend in the first direction, wherein the local bitlines are located within a single corresponding sub cell array and are selectively coupled to corresponding global bitlines;
  a wordline driver on a first side of the cell array that provides a first driving signal for selecting a cell;
  a plateline driver on a second side of the cell array opposite from the first side of the wordline driver that provides a second driving signal for selecting the cell; and
  a reference bitline controller having a reference sense amplifier that senses a signal provided through one of the at least one pair of reference global bitlines and outputs a reference voltage.

2. The non-volatile ferroelectric memory of claim 1, further comprising:
  a bitline controller having a plurality of sense amplifiers coupled to sense a signal provided through the global bitlines, respectively, wherein the sense amplifiers receive the reference voltage, wherein the reference bitline controller is on a third side of the cell array between the first and second sides.

3. The non-volatile ferroelectric memory of claim 2, wherein each of the sub cell arrays comprises:
  a plurality of signal line pairs being a wordline and a plateline extending in a second direction substantially perpendicular to the global bitlines and the local bitlines; and
  a plurality of unit cells each coupled to one of the local bitlines and a pair of the plurality of signal line pairs being the wordline and the plateline.

4. The non-volatile ferroelectric memory of claim 3, wherein said each unit cell includes a transistor having a control electrode coupled to the wordline, a first electrode coupled to the local bitline, and a second electrode coupled to a second side of a ferroelectric capacitor of which a first side is coupled to the plateline, and wherein a selected one of the global bitlines is provided with a data of only one selected unit cell from a plurality of unit cells coupled to the local bitlines formed in correspondence to the selected global bitline.

5. The non-volatile ferroelectric memory of claim 2, wherein the bitline controller further includes a precharge circuit that precharges two adjacent global bitlines to a prescribed level.

6. The non-volatile ferroelectric memory of claim 2, wherein a constant voltage is applied to the other reference global bitline of the at least one pair of reference global bitlines, wherein the other reference global bitline is not coupled to the reference sense amplifier.

7. The non-volatile ferroelectric memory of claim 2, wherein the reference bitline controller further includes a bitline precharge circuit coupling said one of the at least one pair of reference global bitlines and at least a last global bitline among the plurality of global bitlines.

8. The non-volatile ferroelectric memory of claim 7, wherein the bitline precharge circuit is coupled to the plurality of global bitlines, comprising:
  a plurality of equalizing switches provided between respective adjacent global bitlines; and
  a plurality of bitline precharge switches each that switches a precharge signal that precharges a pair of adjacent global bitlines.

9. The non-volatile ferroelectric memory of claim 8, wherein each of the equalizing switches and the bitline precharge switch includes an NMOS transistor.

10. The non-volatile ferroelectric memory of claim 8, wherein a level of the bitline precharge signal is one of approximately equal to and approximately slightly higher than a threshold voltage of a NMOS transistor.

11. The non-volatile ferroelectric memory of claim 8, wherein one of the bitline equalizing switches is turned on responsive to a switch control signal for equalizing two adjacent global bitlines to equal levels.

12. The non-volatile ferroelectric memory of claim 8, wherein the precharge signal is supplied by a bitline precharge level supplier, the bitline precharge level supplier comprising:
  a first transistor of a first conductivity type having a first electrode coupled to a first reference voltage and adapted to be controlled by an enable signal for use in enabling the bitline precharge level supplier;
  a second first conductivity type transistor and a third first conductivity type transistor each having a first electrode coupled to a second electrode of the first conductivity type transistor and a control electrode coupled together;
  a first second conductivity type transistor adapted to be controlled by a second electrode voltage of the third first conductivity type transistor for selectively providing a second reference voltage;
  a second transistor of the second conductivity type coupled between the second first conductivity type transistor and the first second conductivity type transistor and adapted to be controlled by an external reference voltage;
  a third second conductivity type transistor coupled between the third first conductivity type transistor and the first second conductivity type transistor and adapted to be controlled by an output terminal voltage;

a fourth first conductivity type transistor and a fifth first conductivity type transistor each having a first electrode coupled to the second electrode of the first conductivity type transistor and a control electrode coupled together;

a fourth second conductivity type transistor adapted to be controlled by control electrode voltages of the fourth first conductivity type transistor and the fifth first conductivity type transistor for selectively providing the second reference voltage;

a fifth second conductivity type transistor having a first electrode coupled to the second electrode of the first conductivity type transistor and adapted to be controlled by a second electrode voltage of the fifth first conductivity type transistor;

a sixth second conductivity type transistor coupled between a control electrode and a second electrode of the fifth second conductivity type transistor and adapted to be controlled by a second electrode voltage of the second transistor of the second conductivity type;

a seventh second conductivity type transistor adapted to be controlled by the second electrode voltage of the third first conductivity type transistor and coupled between the fourth first conductivity type transistor and the fourth second conductivity type transistor;

an eighth second conductivity type transistor adapted to be controlled by a second electrode voltage of the second transistor of the second conductivity type and coupled between the fifth first conductivity type transistor and the fourth second conductivity type transistor;

a ninth second conductivity type transistor adapted to be controlled by the second electrode voltage of the second transistor of the second conductivity type and having a second electrode coupled to the output terminal voltage; and a tenth second conductivity type transistor coupled between a first electrode of the ninth second conductivity type transistor and the second reference voltage and having a control electrode and second electrode coupled together.

13. The non-volatile ferroelectric memory of claim 12, further comprising:

a sixth first conductivity type transistor coupled between the first electrode of the first conductivity type transistor and adapted to be controlled by an enable signal for use in enabling the bitline precharge level supplier; and a seventh first conductivity type transistor and an eleventh second conductivity type transistor coupled in series between the sixth first conductivity type transistor and the second reference voltage.

14. The non-volatile ferroelectric memory of claim 13, wherein a control electrode and a second electrode of the eleventh second conductivity type transistor are coupled together, a second electrode and a control electrode of the seventh first conductivity type transistor are coupled together, and wherein the second electrode of the seventh first conductivity type transistor and the eleventh second conductivity type transistor are coupled together.

15. The non-volatile ferroelectric memory of claim 2, wherein the reference sense amplifier comprises:

a level shifter that receives a signal through a reference global bitline and shifting a level of the signal; and a pull down controller that pulls down the reference global bitline, wherein the level shifter comprises, a first transistor of a first conductivity type adapted to be controlled by an enable signal for enabling the level shifter and having a first electrode coupled to a first reference voltage, a second first conductivity type transistor and a third first conductivity type transistor coupled to a second electrode of the first conductivity type transistor, a first second conductivity type transistor coupled to the second first conductivity type transistor and adapted to be controlled by the signal on the reference global bitline a second transistor of the second conductivity type coupled between the first second conductivity type transistor and the third first conductivity type transistor and having a first electrode coupled to a first electrode of the first second conductivity type transistor, a third second conductivity type transistor coupled to the first electrode of the first second conductivity type transistor and a second reference voltage and adapted to be controlled by a second electrode voltage of the second first conductivity type transistor, a fourth first conductivity type transistor and a fifth first conductivity type transistor each having a first electrode coupled to a second electrode of the first conductivity type transistor and control electrodes coupled together, a fourth second conductivity type transistor adapted to be controlled by the reference global bitline signal and having a second electrode coupled to a second electrode of the fourth first conductivity type transistor, a fifth second conductivity type transistor adapted to be controlled by a voltage at an output terminal and having a second electrode coupled to a second electrode of the fifth first conductivity type transistor and a first electrode coupled to a first electrode of the fourth second conductivity type transistor, a sixth second conductivity type transistor adapted to be controlled by a second electrode voltage of the fifth second conductivity type transistor and coupled between the first electrodes of the fourth and fifth second conductivity type transistors and the second reference voltage, a sixth first conductivity type transistor adapted to be controlled by an external reference voltage control signal and having a first electrode coupled to a second electrode of the first conductivity type transistor, a seventh second conductivity type transistor adapted to be controlled by a second electrode voltage of the third first conductivity type transistor and having a first electrode coupled to a second electrode of the sixth first conductivity type transistor, an eighth second conductivity type transistor adapted to be controlled by a second electrode voltage of the fourth second conductivity type transistor and coupled between the second electrode of the third first conductivity type transistor and the second electrode of the seventh second conductivity type transistor, a ninth second conductivity type transistor and a tenth second conductivity type transistor adapted to be controlled by the reference voltage control signal and coupled in series between the seventh second conductivity type transistor and the second reference voltage, and a seventh first conductivity type transistor adapted to be controlled by the second electrode voltage of the fourth second conductivity type transistor and having a first electrode coupled to the second electrode of the first conductivity type transistor and a second electrode coupled to the output terminal.

16. The non-volatile ferroelectric memory of claim 2, wherein at least one of the sense amplifiers comprises:

a first second conductivity type transistor having a first electrode coupled both to a global bitline coupled to an upper main cell and to a global bitline coupled to a lower main cell;

a second transistor of the second conductivity type having a first electrode coupled to a reference global bitline coupled to an upper reference cell and to a reference global bitline coupled to a lower reference cell and a control electrode coupled to a control electrode of the first second conductivity type transistor;

a first amplifier that comprises,
  a third second conductivity type transistor for amplifying a signal voltage received from the first second conductivity type transistor, and
  a fourth second conductivity type transistor for amplifying a reference voltage received through the second transistor of the second conductivity type; and a second amplifier having a latch circuit for second amplification of a voltage difference amplified by the third and fourth second conductivity type transistors.

17. The non-volatile ferroelectric memory of claim 16, wherein the latch circuit includes a first inverter and a second inverter, wherein control electrodes of series coupled first conductivity type transistor and second conductivity type transistor in the first inverter are coupled together and to a second electrode of a first conductivity type transistor in the second inverter, and control electrodes of series coupled first conductivity type transistor and an second conductivity type transistor in the second inverter are coupled together and to a second electrode of the first conductivity type transistor in the first inverter, wherein second electrodes of the second conductivity type transistor of the first inverter and the second conductivity type transistor of the second inverter are respectively coupled to a sense amplifier enable signal input terminal.

18. The non-volatile ferroelectric memory of claim 16, further comprising:

a fifth second conductivity type transistor between the first electrode of the first second conductivity type transistor and the global bitline coupled to the upper main cell;

a sixth second conductivity type transistor between the first electrode of the first second conductivity type transistor and the global bitline coupled to the lower main cell;

a seventh second conductivity type transistor between the first electrode of the second conductivity type transistor and the reference global bitline coupled to the upper reference cell;

an eighth second conductivity type transistor between the first electrode of the second conductivity type transistor and the global bitline coupled to the lower reference cell;

a ninth second conductivity type transistor that selectively switches between the output terminal of the sense amplifier and a data bus in response to a column selection signal; and a tenth second conductivity type transistor that selectively switching between the data bus.

19. A non-volatile ferroelectric memory comprising:

a cell array having a plurality of sub cell arrays, a plurality of global bitlines and at least one pair of reference global bitlines extending in a first direction to cross the sub cell arrays, local bitlines and reference local bitlines respectively corresponding to the global bitlines and the reference global bitlines that also extend in the first direction, and switches each disposed between one of the local bitlines and a corresponding global bitline;

a first controller that senses a first signal provided through one of the at least one pair of reference global bitlines and outputs a reference voltage;

a second controller coupled to sense a second signal provided through the global bitlines, respectively, having sense amplifiers that receive the reference voltage;

a wordline driver on one side of the cell array that provides a first driving signal for selecting a cell; and a plateline driver on the opposite side of the cell array from the wordline driver that provides a second driving signal for selecting the cell.

20. The non-volatile ferroelectric memory of claim 19, wherein the first controller comprises:

a first reference bitline controller of a first reference sense amplifier above the cell array that senses the first signal provided through one of the at least one pair of reference global bitlines to provide a first reference voltage.

21. The non-volatile ferroelectric memory of claim 20, wherein the first controller further comprises:

a second reference bitline controller of a second reference sense amplifier below the cell array that provides a voltage substantially equal to the first reference voltage, and wherein the second controller comprises,
  a first bitline controller adjacent the first reference bitline controller coupled to a first set of the global bitlines among the plurality of global bitlines for receiving the first reference voltage to sense the second signal provided through the first set of the global bitlines, and
  a second bitline controller adjacent the second reference bitline controller coupled to a second set of the global bitlines among the plurality of global bitlines for receiving the second reference voltage to sense the second signal provided through the second set of the global bitlines.

22. The non-volatile ferroelectric memory of claim 21, wherein the first set of the global bitlines are even-numbered global bitlines, and wherein the second set of the global bit lines are odd-numbered global bitlines.

23. The non-volatile ferroelectric memory of claim 19, wherein a number of access times for a main memory cell and a reference memory cell are the same for the cell array.

* * * * *